(12) United States Patent
Kosonocky et al.

(10) Patent No.: US 11,962,313 B2
(45) Date of Patent: *Apr. 16, 2024

(54) ADAPTIVE DCO VF CURVE SLOPE CONTROL

(71) Applicants: Advanced Micro Devices, Inc., Santa Clara, CA (US); ATI Technologies ULC, Markham (CA)

(72) Inventors: Stephen Victor Kosonocky, Fort Collins, CO (US); Mikhail Rodionov, Richmond Hill (CA); Joyce Cheuk Wai Wong, Toronto (CA)

(73) Assignees: Advanced Micro Devices, Inc., Santa Clara, CA (US); ATI Technologies ULC, Markham (CA)

( * ) Notice: Subject to any disclaimer, the term of this patent is extended or adjusted under 35 U.S.C. 154(b) by 393 days.

This patent is subject to a terminal disclaimer.

(21) Appl. No.: 16/370,479

(22) Filed: Mar. 29, 2019

(65) Prior Publication Data

US 2019/0229736 A1  Jul. 25, 2019

Related U.S. Application Data

(63) Continuation-in-part of application No. 15/390,397, filed on Dec. 23, 2016, now Pat. No. 10,382,014.

(51) Int. Cl.
*H03L 7/099* (2006.01)
*H03K 5/14* (2014.01)
*H03K 5/00* (2006.01)

(52) U.S. Cl.
CPC ............ *H03L 7/0991* (2013.01); *H03K 5/14* (2013.01); *H03K 2005/00058* (2013.01)

(58) Field of Classification Search
CPC .... H03K 3/012; H03K 5/1508; H03K 5/1534; H03L 5/00; H03L 5/02; H03L 7/0997
See application file for complete search history.

(56) References Cited

U.S. PATENT DOCUMENTS 5,619,405 A * 4/1997 Kammiller ............ H02M 3/156
363/80
6,806,750 B1  10/2004 Rasmussen et al.
(Continued)

OTHER PUBLICATIONS

Konstadinidis et al.( "SPARC M7: A 20 nm 32-Core 64 MB L3 Cache Processor", IEEE Journal of Solid-State Circuits, IEEE, USA, vol. 51, No. 1, Jan. 1, 2016 (Jan. 1, 2016), pp. 79-91) (Year: 2016).*

(Continued)

*Primary Examiner* — Patrick C Chen
(74) *Attorney, Agent, or Firm* — Polansky & Associates, P.L.L.C.; Paul J. Polansky; Nathan H. Calvert

(57) ABSTRACT

An oscillator circuit is provided that adapts to voltage supply variations. The circuit first and second delays lines connected inputs of an edge detector, one delay line supplied by a reference voltage and the other with a drooping supply voltage. The edge detector generates an output clock based on a relationship between the inputs. The output clock applied to the signal inputs of the first and second delay lines. The output clock has a voltage dependent frequency performance curve with a slope dependent at least on the second delay line delay and a delay of the edge detector. At least one of the first delay line, the second delay line, and the edge detector delay are adjusted to change the slope of the performance curve.

20 Claims, 17 Drawing Sheets

(56) References Cited

U.S. PATENT DOCUMENTS

| | | |
|---|---|---|
| 6,928,128 B1 | 8/2005 | Sidiropoulos |
| 2003/0112038 A1 | 6/2003 | Naffziger et al. |
| 2004/0183613 A1 | 9/2004 | Kurd et al. |
| 2006/0170471 A1 | 8/2006 | Haerle et al. |
| 2010/0194456 A1 | 8/2010 | Kang et al. |
| 2011/0063003 A1 | 3/2011 | Friedman et al. |
| 2012/0176156 A1 | 7/2012 | Chang et al. |
| 2013/0249611 A1 | 9/2013 | Vandepas et al. |
| 2013/0305840 A1* | 11/2013 | Saari .................. G01L 1/26 73/862.08 |
| 2015/0029800 A1* | 1/2015 | Iijima ............ H03K 19/0016 365/193 |
| 2015/0244354 A1 | 8/2015 | Parikh |
| 2015/0365093 A1* | 12/2015 | YangGong ......... H03L 7/0802 331/1 A |
| 2016/0149563 A1 | 5/2016 | Kim et al. |
| 2016/0380641 A1* | 12/2016 | Hashimoto .......... H03L 7/18 331/177 R |

OTHER PUBLICATIONS

Yifan Yangong et al.; "Asymmetric Frequency Locked Loop (AFLL) for Adaptive Clock Generation in a 28nm SPARC M6 Processor"; IEEE Asian Solid-Slate Circuits Conference; pp. 373-376; Nov. 10-12, 2014; KaoHsiung, Taiwan; 4 pages.

* cited by examiner

ADAPTIVE DCO VF CURVE SLOPE CONTROL

BACKGROUND

A clock generator circuit needs to supply a stable clock signal that is stable to sequential components of an integrated circuit in order for the integrated circuit components to function correctly in accordance with their design. Clock generator circuits are typically oscillators which supply a system clock signal to components of an integrated circuit at a certain frequency.

The ability of a clock oscillator circuit to supply a stable input or system clock signal to an integrated circuit system may be affected by noise on the power supply line. Noise on a power supply line may cause the power supply voltage to vary from a certain reference voltage level. Noise may include, for example, without limitation, deterministic noise sources and random noise sources. Deterministic noise sources may include noise such as, without limitation, crosstalk between adjacent signal traces, electromagnetic interference radiation, substrate noise, multiple gate switching, and simultaneously switching gates. Random noise sources may include noise such as, without limitation, thermal noise associated with electron flow, shot noise due to potential barriers in semiconductors, flicker noise associated with crystal surface defects in semiconductors. Noise may cause the power supply voltage to fall below or droop below a desired reference voltage level. Alternatively, the noise on the power supply line may cause the power supply voltage to rise above or overshoot a desired reference voltage level. Noise on the power supply line may result in fluctuations or jitter on a system clock signal line that affects the stability and operation of the sequential components of an integrated circuit. Compensating for noise on the power supply line is typically a two-step process. In a first step, a system or circuit must first detect and indicate when there is noise on the power supply line. In a second step, in response to the indication of noise that causes a power supply droop, a signal must be generated to another circuit that will slow down the output system clock frequency as long as the noise exists. Another way a system may compensate for noise on the power supply voltage is by adding extra margin to the power supply voltage so that when there is fluctuation such as droop on the supply line, it is covered by the added margin and does not result in violation of clock circuit timing which may cause the functional timing of the chip to fail.

However, the two-step process tends to be slow. For example, first, a circuit has to detect noise on a voltage supply line which is sometimes very difficult to detect because noise, in some instances, may be so transient that it may last less than a nanosecond. A nanosecond is a short period of time for detection and notification. Additionally, adding margins to power supply voltage results in the integrated circuit burning significantly more power and an increase in power consumption of an integrated circuit results in a lack of energy efficiency.

Figure 1:
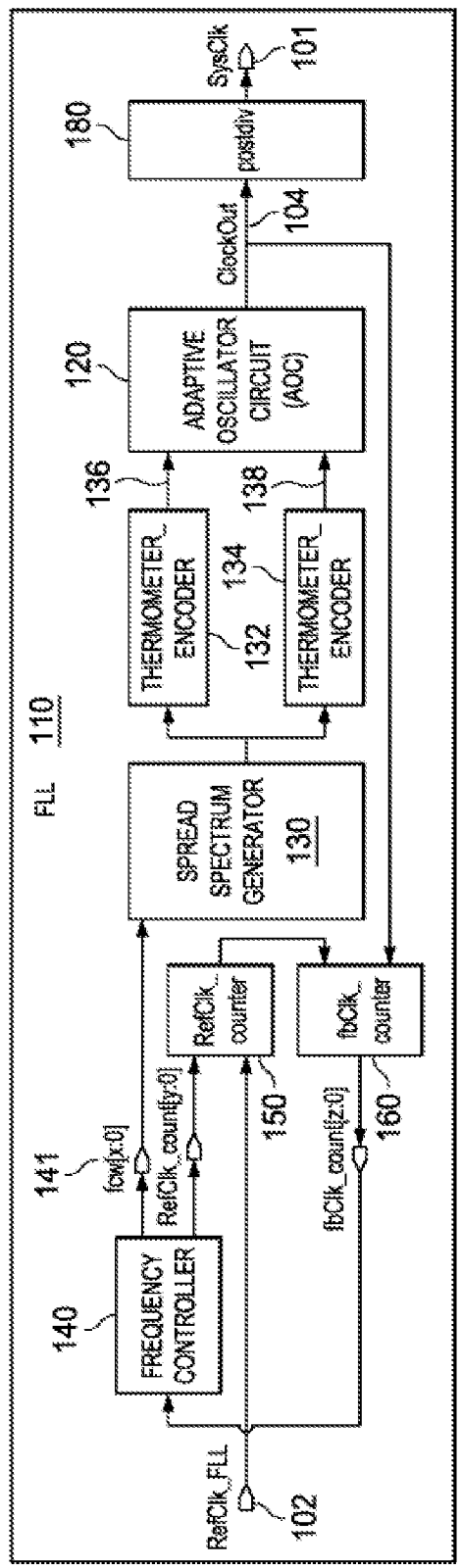
FIG. 1 is a block diagram of an illustrative clock generator system in which an Adaptive Oscillator Circuit may be implemented in accordance with an illustrative embodiment of the disclosure.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

It should be understood at the outset that although an illustrative embodiment of one or more embodiments are provided below, the description is not to be considered as limiting the scope of the embodiments described herein. The disclosure may be implemented using any number of techniques, whether currently known or in existence. The disclosure should in no way be limited to the illustrative implementations, drawings, and techniques illustrated and described herein, which may be modified within the scope of the appended claims along with the full scope of equivalents. It should be appreciated that for simplicity and clarity of illustration, where considered appropriate, the reference numerals may be repeated among the figures to indicate corresponding or analogous elements.

The present disclosure provides for an adaptive oscillator circuit that automatically adjusts or adapts the frequency of its output clock in proportion to the noise on an input or core power supply line. The input or core power supply is the voltage supply that feeds the processor cores, the application specific integrated circuits, and any other component blocks on a chip. Noise on the core power supply affects delay time in a chip and also affects the maximum operational frequency of the chip. Noise on the core power supply line may be caused by, without limitation, noise, spikes in processing activity, simultaneous switching, ringing, and other such events which cause the input power supply line to droop or overshoot in relation to a target power supply voltage. The target power supply voltage is a supply voltage that is regulated or generated to be a certain voltage level. In this disclosure, the target power supply may also be referred to as the regulated supply. In this disclosure, the input or core power supply or input power supply line is also referred to as the droopy power supply or droopy power supply line. Noise on the droopy power supply may affect the time a signal takes to propagate from a source to a destination and may also affect the maximum operational frequency of the chip.

In the adaptive oscillator circuit, the frequency of the output clock that goes out to the system to enable clocking of the various components is directly related to the noise on the input power supply line. Sequential circuitry requires clock signals to have sufficient time margin so that they do not fail when the power supply line the circuitry is connected to has noise that affects the propagation delay signal. The frequency tracks or follows the power supply voltage swings, such as, for example, the voltage droops or voltage overshoots, similar to that of the function of a ring oscillator where the frequency follows the power supply voltage. For example, noise on the input power supply line may cause the power supply voltage to droop below the regulated supply voltage level. In response to the droop in voltage, the Adaptive Oscillator Circuit modulates the frequency of the output clock or the time period within which the output system clock changes. Specifically, the output clock frequency is automatically reduced for the duration of the droop to provide more time for sequential circuitry on a chip to complete its function. Conversely, noise on the input power supply line may cause the power supply voltage to overshoot the regulated supply voltage level. In response to the overshoot, the adaptive oscillator circuit clamps the output clock frequency to a target maximum system clock frequency.

An oscillator circuit is provided that adapts to voltage supply variations. The oscillator circuit includes a first delay line having a signal input, a supply input for receiving a first voltage, and an output that transmits a first delayed signal at a first delay proportional to the first voltage, and a second delay line having a signal input, a supply input for receiving a second voltage, and an output that transmits a second delayed signal at a second delay proportional to the second voltage. The oscillator circuit has an edge detector coupled to the first and second delay lines and generating an output clock based on a relationship between the first delayed signal and the second delayed signal, the output clock applied to the signal inputs of the first and second delay lines, the output clock exhibiting a voltage dependent frequency performance curve having a slope dependent at least on the second delay and a delay characteristic of the edge detector. At least one of the first delay line, the second delay line, and the edge detector are operable to adjust the slope by altering the delay characteristic of the edge detector relative at least one of the first and second delays.

A system includes a plurality of components in an integrated circuit, the integrated circuit including a clock tree. A frequency locked loop circuit that generates a system clock that drives the clock tree. An oscillator circuit is provided within the frequency locked loop circuit and includes: a first delay line having a signal input, a supply input for receiving a first voltage, and an output that transmits a first delayed signal at a first delay proportional to the first voltage; a second delay line having a signal input, a supply input for receiving a second voltage, and an output that transmits a second delayed signal at a second delay proportional to the second voltage; and an edge detector coupled to the first and second delay lines and generating an output clock based on a relationship between the first delayed signal and the second delayed signal, the output clock applied to the signal inputs of the first and second delay lines, the output clock exhibiting a voltage dependent frequency performance curve having a slope dependent at least on the second delay and a delay characteristic of the edge detector. At least one of the first delay line, the second delay line, and the edge detector are operable to adjust the slope by altering the delay characteristic of the edge detector relative at least one of the first and second delays.

A method is provided for clock frequency adjustment in an oscillator circuit. The method connects a first delay line to a regulated supply voltage and causing the first delay line to transmit a first delayed signal at a first delay proportional to the regulated supply voltage, and connects a second delay line to a droopy supply voltage and causing the second delay line to transmit a second delayed signal at a second delay proportional to the droopy supply voltage. The method inputs the first delayed signal and the second delayed signal to an edge detector that generates an output clock. A resulting oscillation frequency of the output clock is based on a relationship between the regulated supply voltage and the droopy supply voltage, with the output clock exhibiting a voltage dependent frequency performance curve having a slope dependent at least on the second delay and a delay characteristic of the edge detector. The method feeds the output clock as an input to the first and second delay lines, and adjusts the slope by altering the delay characteristic of the edge detector relative to at the one of the first and second delays.

Turning first to FIG. 1, a block diagram of a clock generator system 100 in which an adaptive oscillator circuit may be implemented is illustrated in accordance with illustrative embodiments of the disclosure. In system 100, a Frequency Lock Loop (FLL) 110 inputs a reference clock, RefClk_FLL 102, for the RefClk_counter 150, and outputs a system clock, SysClk 101. The FLL 110 may serve as the clock generator for a system-on-chip and the output system clock, SysClk 101, is the output oscillator clock that drives the clock tree within the system-on-chip. Turning now to an overview of the FLL 110, a reference clock counter, RefClk_ counter 150, counts a number of reference clock cycles within a specified period. A feedback clock counter, fbClk_counter 160, counts a number of the adaptive oscillator circuit (AOC) 120 clock cycles within a specified period. Frequency controller 140 compares the reference clock count number and the feedback clock counter number and generates the difference in the form of frequency control word, fcw[x:0] 141.

The frequency controller 140 closes the frequency loop in the FLL 110. In one embodiment, frequency controller 140 may contain a Proportional-Integral (PI) controller. In another embodiment, Frequency controller 140 may contain a Proportional-Integral-Differential (PID) controller. The frequency control word, fcw[x:0] 141 may be modulated by the spread-spectrum generator 130 and converted into thermometer code data control signal 136 and thermometer code data control signal 138 by the thermometer encoders 132 and 134. The adaptive oscillator circuit 120 inputs thermometer code data control signals 136, 138 to control a reference delay line (not shown) and a droopy delay line (not shown) in the AOC. The thermometer code data control signals may contain information that may set delay bits or delay offsets in the AOC 120.

The FLL 110 and the adaptive oscillator circuit 120 are powered by a droopy power supply (not shown) and a reference voltage (not shown). The AOC 120 generates an output clock, Clockout 104, with a frequency that is determined by the droopy power supply or the reference power supply. In some embodiments, the FLL 110 may include a post-divider 180 for output frequency post-division of the output clock ClockOut 104 to generate system clock SysClk 101. It must be noted that the AOC 120 is not limited to use in the illustrated system 100 and may be used in other systems that have power supply changes that affect critical paths in a synchronous design.

The illustration of the AOC 120 in the FLL 110 of system 100 is not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

Figure 2:
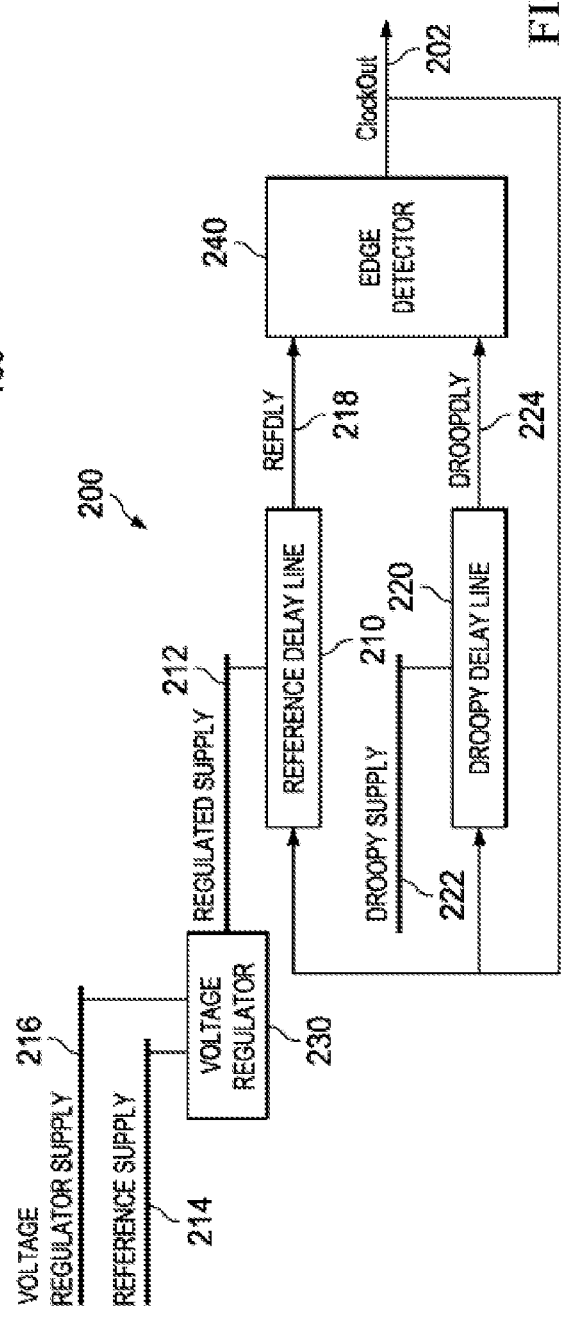
FIG. 2 illustrates a detailed block diagram of the architecture of the Adaptive Oscillator Circuit illustrated in FIG. 1 according to an illustrative embodiment of the disclosure.

FIG. 2 illustrates a diagram 200 of the architecture of the Adaptive Oscillator Circuit (AOC) 120 illustrated in FIG. 1, according to an illustrative embodiment of the disclosure. The AOC 120 may function as a delay line based oscillator. A delay line based oscillator may include, for example, without limitation, a ring oscillator, a digitally controller oscillator, or the like. In one or more illustrative embodiments of this disclosure, the AOC 120 produces an output in a manner that is similar to that of a ring oscillator.

A ring oscillator connects a chain of delay stages together in a closed loop. The output of each stage is used as input for the next one and the output from the last stage is fed back to the first stage. Each stage has a certain propagation delay or a time for a signal to pass from input of a stage to the output of the same stage. Because of the delay of each stage, the whole circuit spontaneously starts oscillating at a certain frequency. The frequency depends on the number of stages and the delay through each stage. For a ring oscillator to start oscillating, the resulting logical function of the chain of delay stages must show a logic inversion function so that when a signal travels from the input of the first stage to the output of the last stage, a signal polarity change occurs. A polarity change means logic "1" becomes logic "0" and/or logic "0" becomes logic "1". It must be noted that, in the illustrative example of FIG. 2, the last stage in the ring oscillation chain is the edge detector 240. The output clock of edge detector 240 feeds back and is input simultaneously to the first stage of the AOC 120 which include the first cells or components (not shown) in both the reference delay line 210 and the droopy delay line 220.

In FIG. 2, the AOC 120 is illustrated as including two delay lines. The two delay lines may be identical to each other with respect to the number and type of internal delay components. The internal components may include, but are in no way limited to, buffers, inverters, or other type of non-sequential elements. The number of delay components in the delay lines may vary. For example, increasing the number of delay elements may reduce the maximum oscillation frequency of the output clock.

Each delay line is powered by a separate power supply connection. The power supply connection to each delay line determines the propagation delay, or the time it takes for a signal to propagate through each respective delay line. In one embodiment, the propagation delay through the first delay line and the second delay line may be the same. In another embodiment, the propagation delay through the first delay line and the second delay line may be different.

Turning first to the power supply connections of a first delay line, reference delay line 210, as illustrated in diagram 200, voltage regulator 230 generates a constant or steady voltage, regulated supply 212, within acceptable or nominal limits. The acceptable or nominal limits are based on a reference supply 214 that may be generated on chip or off-chip, and is set to a certain level that may be higher or lower than the core power supply voltage. One input to the voltage regulator 230 is the voltage regulator supply 216 which is the operational power supply of voltage regulator 230 In some embodiments, the voltage regulator 230 may include a filter, such as, without limitation, a low-pass filter, to smooth out any noise transients for the reference supply 214 to obtain the regulated supply 212. In one embodiment, the reference supply 214 may be the core power supply. In another embodiment, the core power supply may also correspond to droopy supply 222. Reference delay line 210 is connected to the regulated supply 212 that is generated from voltage detector 230. Reference delay line 210 generates a delayed signal, RefDly 218, as one input to edge detector 240.

In some illustrative embodiments, the reference supply 214 has no noise or variation and may be directly connected to the reference delay line 210 instead of the regulated supply 212 which is output of voltage regulator 230. The regulated supply 212 provides a comparison or reference point to determine how far outside the target power supply voltage the droopy supply 222 may swing based on the noise. The target power supply voltage is the standard operating voltage of a system or circuit that excludes any variations or fluctuations.

Turning next to the power supply voltage connections of the second delay line, droopy delay line 220, Droopy supply 222 connects to droopy delay line 220. The droopy supply 222 may be the input or core power supply that supplies the operating voltage for all the components on a system-on-chip. The droopy delay line 220 generates a delayed signal, DroopDly 224 as another input to edge detector 240.

Turning now to the operation of the edge detector 240 of adaptive oscillator circuit 200, edge detector 240 inputs two signals. One input signal to edge detector 240 is the delayed signal, RefDly 218, that is output from reference delay line 210. A second input signal to edge detector 240 is the delayed signal, DroopDly 224, that is output from droopy delay line 220. Edge detector 240 generates output clock, ClockOut 202. The output clock, ClockOut 202, may be output to the system of the AOC. ClockOut 202 also has a feedback path to the inputs of both reference delay line 210 and droopy delay line 220. ClockOut 202 propagates by way of the feedback path to both the reference delay line 210 and the droopy delay line 220 at the same time. It must be noted that changes in polarity may also be implemented inside reference delay line 210 and the droopy delay line 220.

Edge detector 240 toggles its output ClockOut 202 only when both of its inputs are of the same polarity. For example, when both RefDly 218 and DroopDly 224 are at the same polarity of logic zero "0" or logic one "1", the output ClockOut 202 toggles or changes polarity. A change in polarity is said to occur when a signal changes from a first defined state to a different second defined state, for example, without limitation, from 0 to 1. The logical operation of edge detector 240 is shown in Table 1.

TABLE 1

| Edge Detector Logical Operation | | |
|---|---|---|
| RefDly | DroopDly | ClockOut |
| 0 | 0 | Toggle |
| 0 | 1 | No change; Retain current polarity |
| 1 | 0 | No change; Retain current polarity |
| 1 | 1 | Toggle |

Edge detector 240 may be implemented by one or more components that operate in accordance with the edge detector logical operation shown in Table 1. In one or more illustrative embodiments of this disclosure, the edge detector 240 may be implemented by a Muller C-element. In operation, the output of the Muller C-element toggles on the edge of the latest arriving signal of the same polarity.

The output of the edge detector 240, ClockOut 202, may be output to generate a system clock and feeds back to the input stage of reference delay line 210 and the input stage of droopy delay line 220 based on the ring oscillator architecture of the AOC. The time it takes for ClockOut 202 to propagate through reference delay line 210 and droopy delay line 220 and affect the output of edge detector 240 depends on the input power supply voltage that connects to each respective delay line. More specifically, in operation, ClockOut 202 toggles in accordance with the delayed signal that has the greater propagation delay or is the slower of the two delayed signals between RefDly 218 and DroopDly 224. Edge detector generates a ClockOut 202 that has a slower frequency when there is noise that causes droop on droopy delay line 220. In sum, frequency of the output system clock, ClockOut 202, is determined by the reference delay line 210 or the droopy delay line 220.

Figure 3:
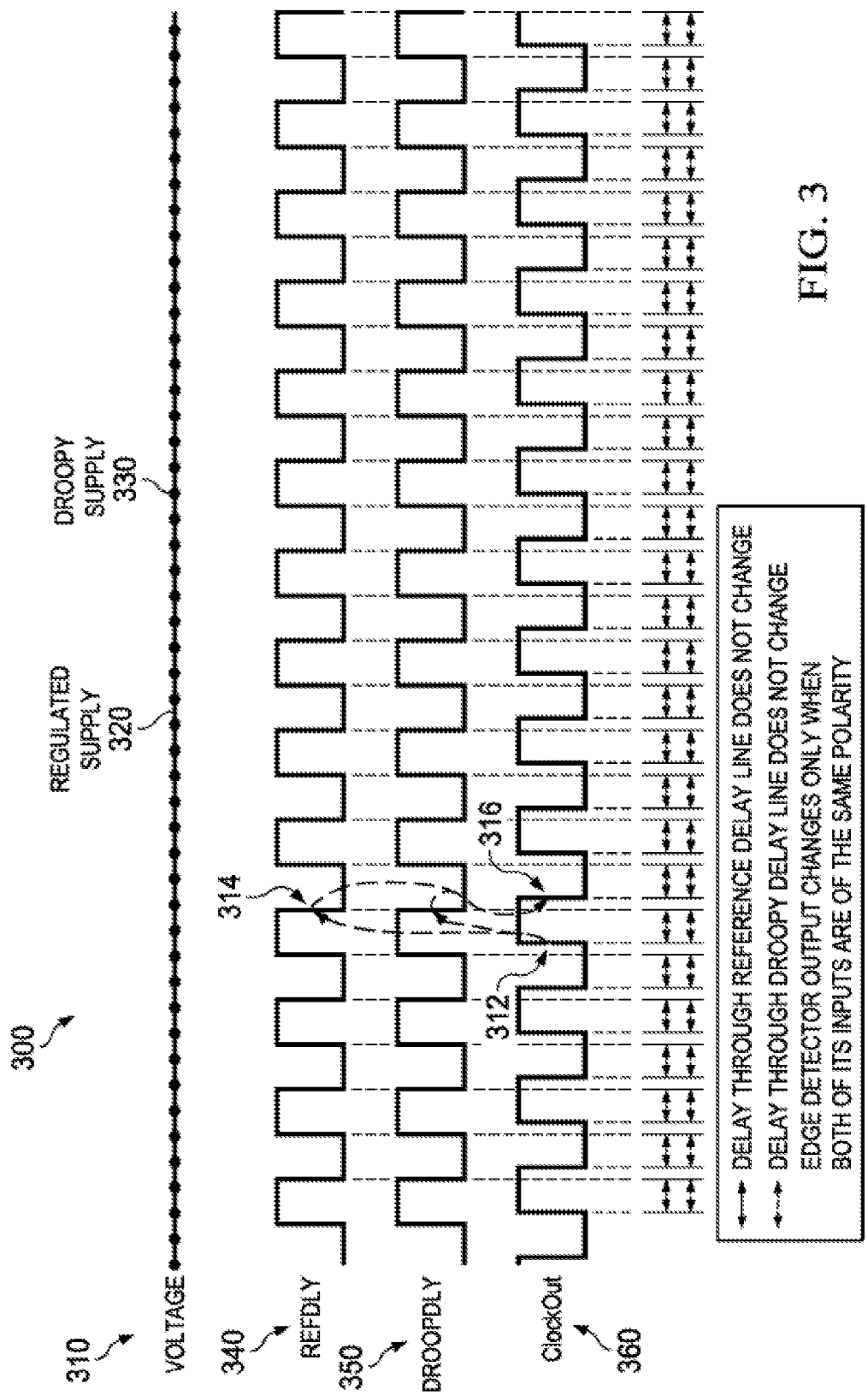
FIG. 3 is an illustrative embodiment of a general timing diagram of the operation of the Adaptive Oscillator Circuit of FIG. 2 in accordance with an illustrative embodiment of the disclosure.

Turning now to FIG. 3, an illustrative embodiment of a general timing diagram 300 of the operation of the adaptive oscillator circuit is illustrated according to an illustrative embodiment of the disclosure. In the depicted example, the timing diagram 300 is an example of one implementation for adaptive oscillator circuit 200 in FIG. 2.

As illustrated, on the voltage axis 310, the regulated supply voltage 320 and the droopy supply voltage 330 are at a same voltage. ClockOut 360 is the output clock signal from edge detector 240. As depicted, when regulated supply 320 and droopy supply 330 are at a same voltage level on voltage axis 310, reference delay line 210 and droopy delay line 220 take the same amount of time to propagate ClockOut 360 as shown at 312 and change the polarity of RefDly 340 and DroopDly 350 as shown at 314. Based on the logical operation of edge detector 240, ClockOut 360 would toggle immediately as illustrated at 316.

Figure 4:
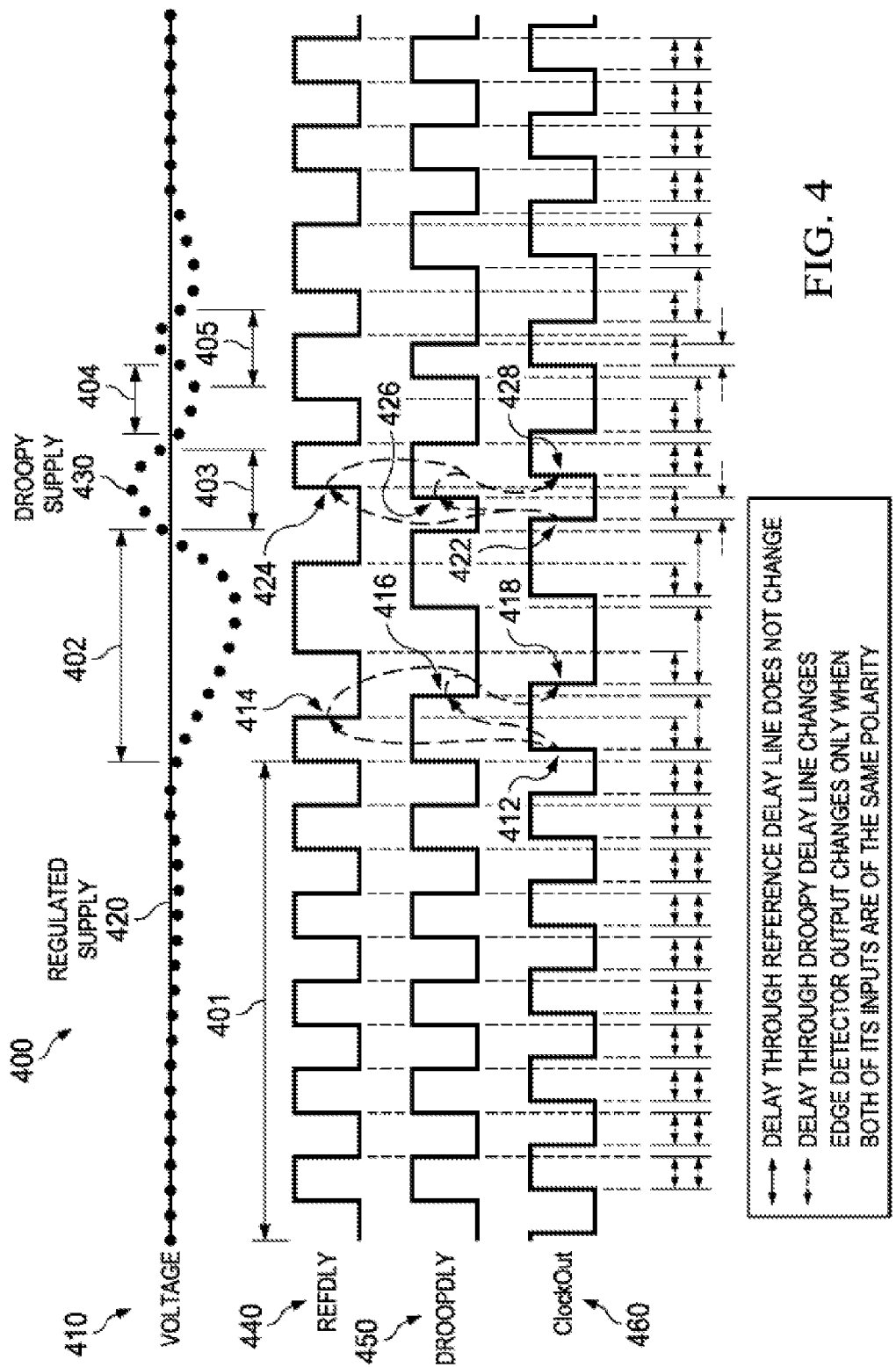
FIG. 4 illustrates a timing diagram of the operation of the Adaptive Oscillator Circuit of FIG. 2 in accordance with an illustrative embodiment of the disclosure.

FIG. 4 is an illustrative embodiment of a timing diagram 400 of the operation of the adaptive oscillator circuit 200. In the illustrative example, timing diagram 400 is an example of one implementation of the operation of the adaptive oscillator architecture in FIG. 2.

As depicted in the example, the droopy supply voltage level 430 is shown in relation to the regulated supply voltage level 420 on input voltage line 410. The regulated supply voltage 420 remains relatively constant at a fixed level of voltage 410.

As depicted, during a time period 401, the droopy supply 430 is relatively constant at the level of regulated supply 420 on voltage line 410. When regulated supply 420 and droopy supply 430 are at the same voltage level, RefDly 440 and DroopDly 450 change polarity at the same time. ClockOut 460 toggles immediately when RefDly 440 and DroopDly 450 are of the same polarity.

During a time period 402 and again at a time period 404, droopy supply 430 droops or swings lower than the regulated supply 420. The droop may be caused by noise or some other circuit disturbance. The lowered voltage level of droopy supply 430 relative to the regulated supply 420 causes the propagation delay of ClockOut 460 at 412 through droopy delay line 220 to 416 to be longer than the propagation delay of ClockOut 460 at 412 through reference delay line 210 to 414. This may cause DroopDly 450 to toggle at a later time than RefDly 440 as depicted at 416. Therefore, as shown at 418, ClockOut 460, will follow the change in polarity of DroopDly 450. The delay in toggling DroopDly 450 is equivalent to stretching the period of ClockOut 460.

During a time period 403 and again at time period 405, the droopy supply 430 overshoots or swings higher than the regulated supply 420. As a result, the time it takes for ClockOut 460 at 422 to propagate through droopy delay line 220 to DroopDly 450 at 426 is faster than the time it takes for ClockOut 460 to propagate through reference delay line 210 to RefDly 440 at 424. Nevertheless, the period of ClockOut toggles at 428 at rate based on the slower propagation delay of RefDly 440.

In summary, in the illustrative timing examples of FIG. 3 and FIG. 4, the clock period and frequency of ClockOut 460 of the Adaptive Oscillator 200 depicted in FIG. 2 are determined by the delay line that has the slower propagation delay based on their respective voltage level. In an ideal operation where the voltage level of the regulated supply 420 and the droopy supply 430 are the same, the propagation time through the reference delay line and the droopy delay line are the same. In illustrative embodiments of this disclosure where noise is present on the droopy supply 430 which causes droops relative to the regulated supply 420, the propagation time through the droopy delay line 220 is slower than that of the propagation time through the reference delay line 210. In such cases, the slower delay through droopy delay line 220 will determine the output period of ClockOut 460. In illustrative embodiments of this disclosure where noise is present on the droopy supply 430 which causes overshoots relative to the regulated supply 420, the propagation time through the droopy delay line 220 is faster than that of the propagation time through the reference delay line 210. In such cases, the slower delay through the reference delay line 210 determines the output period of ClockOut 460.

More specifically, in operation, FIG. 4, at times 402 and 404, illustrates noise on the droopy supply 430 that may cause the droopy supply voltage level to droop below the regulated supply 420. The lower voltage may cause the time ClockOut 460 to propagate through the droopy delay line to DroopDly 450 to be longer than the time ClockOut 460 needs to propagate through the reference delay line to RefDly 440. The period of ClockOut 460 remains stretched during time 402 for as long as droop exists on the droopy supply 430. The resulting frequency of ClockOut 460 will therefore be determined by the droopy supply 430.

In addition, FIG. 4, at times 403 and 405, illustrates noise on the droopy supply 430 that may cause the droopy supply voltage level to swing above or overshoot the regulated supply 420. As a result, the time it may take for ClockOut 460 to propagate through the droopy delay line to DroopDly 450 may be faster than the propagation time through the reference delay line to RefDly 440. In this case, the time period or frequency of the output clock, ClockOut 460 is determined by RefDly 440 which has the slower propagation delay.

Figure 5:
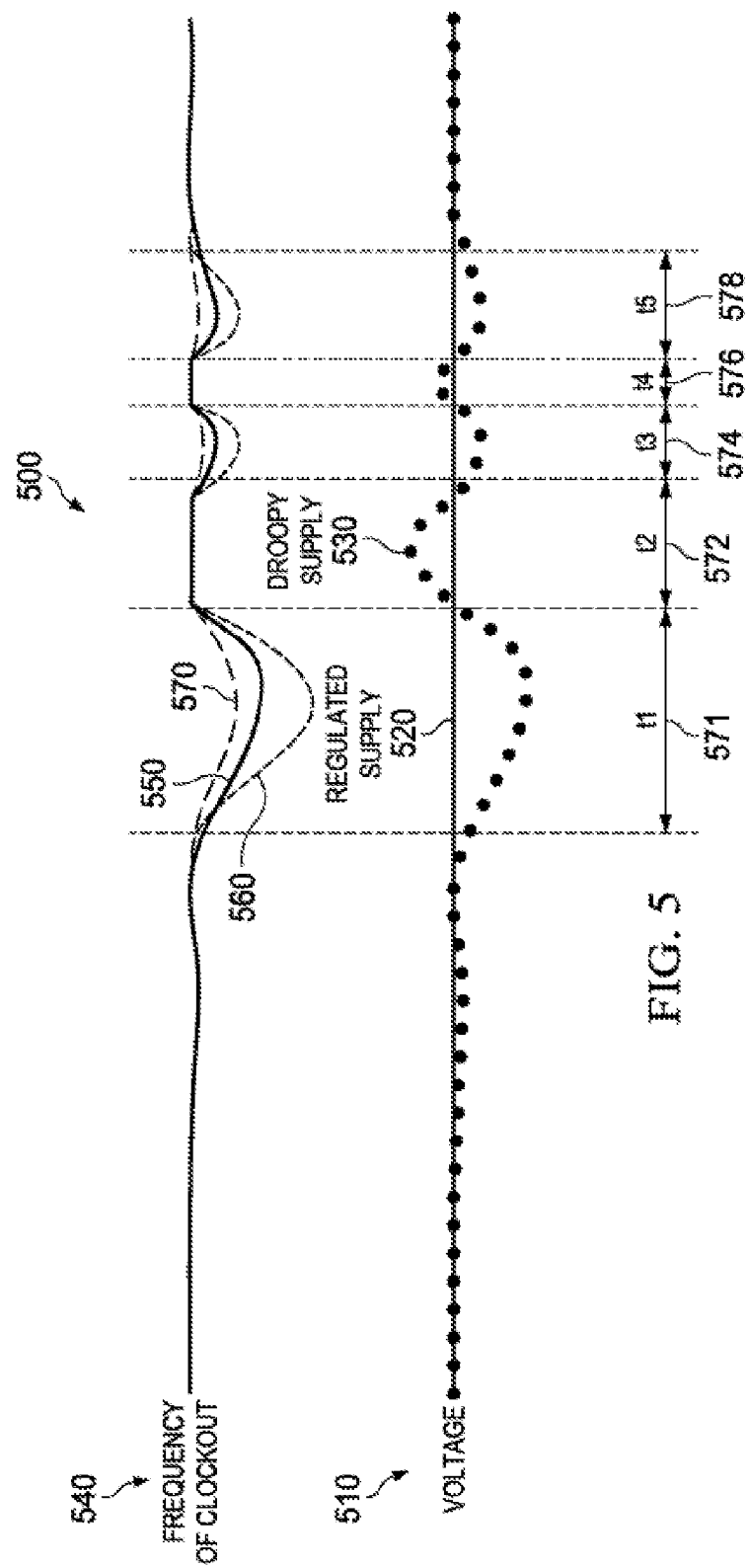
FIG. 5 illustrates a diagram of the change in frequency of the output clock of the Adaptive Oscillator Circuit relative to the change in voltage in accordance with an illustrative embodiment of the disclosure.

FIG. 5 illustrates a diagram 500 of the change in frequency of the output clock of the Adaptive Oscillator Circuit relative to the change in voltage in accordance with an illustrative embodiment of the disclosure. In the illustrative example, the Frequency of Clockout axis 540 illustrates the change in frequency relative to change in voltage as illustrated on the Voltage axis 510. In general, it must be noted that a frequency on the Frequency of ClockOut axis 540 tracks the droopy supply on the Voltage axis 510. In the depicted example, frequency 550 decreases when the droopy supply voltage decreases. In an alternative embodiment, frequency 560 and 570 illustrate frequencies that also decrease as the droopy supply voltage decreases but the level of frequency decrease for frequency 560 and 570 may be adjustable or programmable.

In the illustrative example, during a time t1 571, and again at a time t3 574 and t5 578, droopy supply 530 droops below regulated supply 520. The frequency 550 of ClockOut from the AOC will slow down as it tracks the droopy supply 530.

Programmable frequencies 560 and 570 will similarly track the droopy supply 530 decrease but at a predetermined programmed level. In the illustrative example, during a time t2 572 and again at a time t4 576, droopy supply 530 overshoots the regulated supply 520. In cases of overshoot, frequency 550 on the frequency of clockout axis 540 clamps at a level based on the regulated supply 520 as shown during the t2 572 and t4 576 time periods. Similarly, programmable frequencies 560 and 570 also clamp at a level based on the regulated supply during a time period where the droopy supply 530 overshoots the regulated supply 520.

Figure 6:
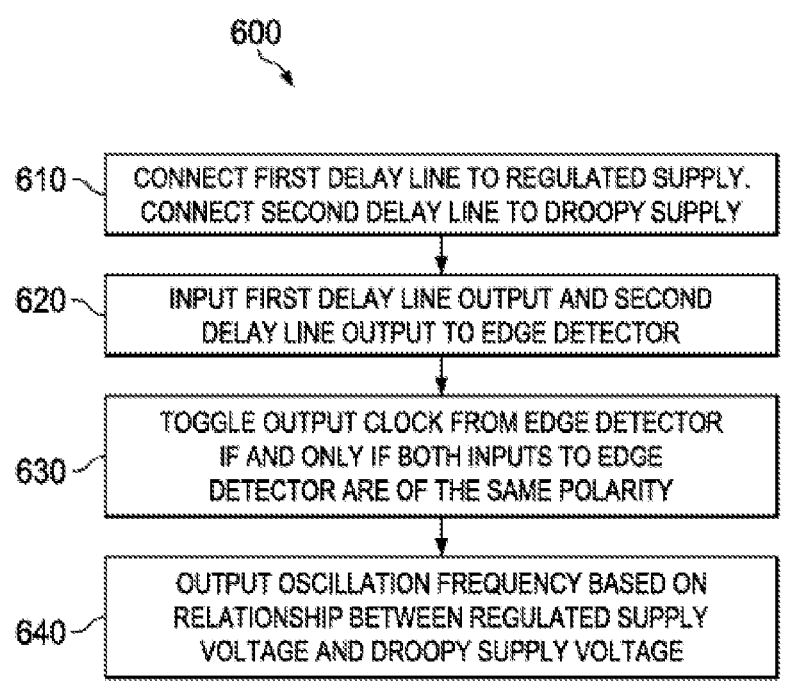
FIG. 6 illustrates a flowchart of the general operation of the Adaptive Oscillator Circuit in accordance with an illustrative embodiment of the disclosure.

Turning now to FIG. 6, a flowchart 600 is illustrated of the operation of the adaptive oscillator circuit according to an illustrative embodiment of the disclosure. At block 610, the operating conditions are established wherein a first delay line is connected to a regulated supply and a second delay line is connected to a droopy supply. At a block 620, the output from the first delay line and the output from the second delay line is input to an edge detector. At block 630, the edge detector toggles the output clock if an only if both inputs to the edge detector from the first delay line and the second delay line are of the same polarity. At a block 640, the output frequency of the clock from the edge detector is determined based on the relationship between the regulated supply voltage and the droopy supply voltage. The output clock is output to the system and also feeds back to the input stages of the first delay line and the second delay line.

Figure 7:
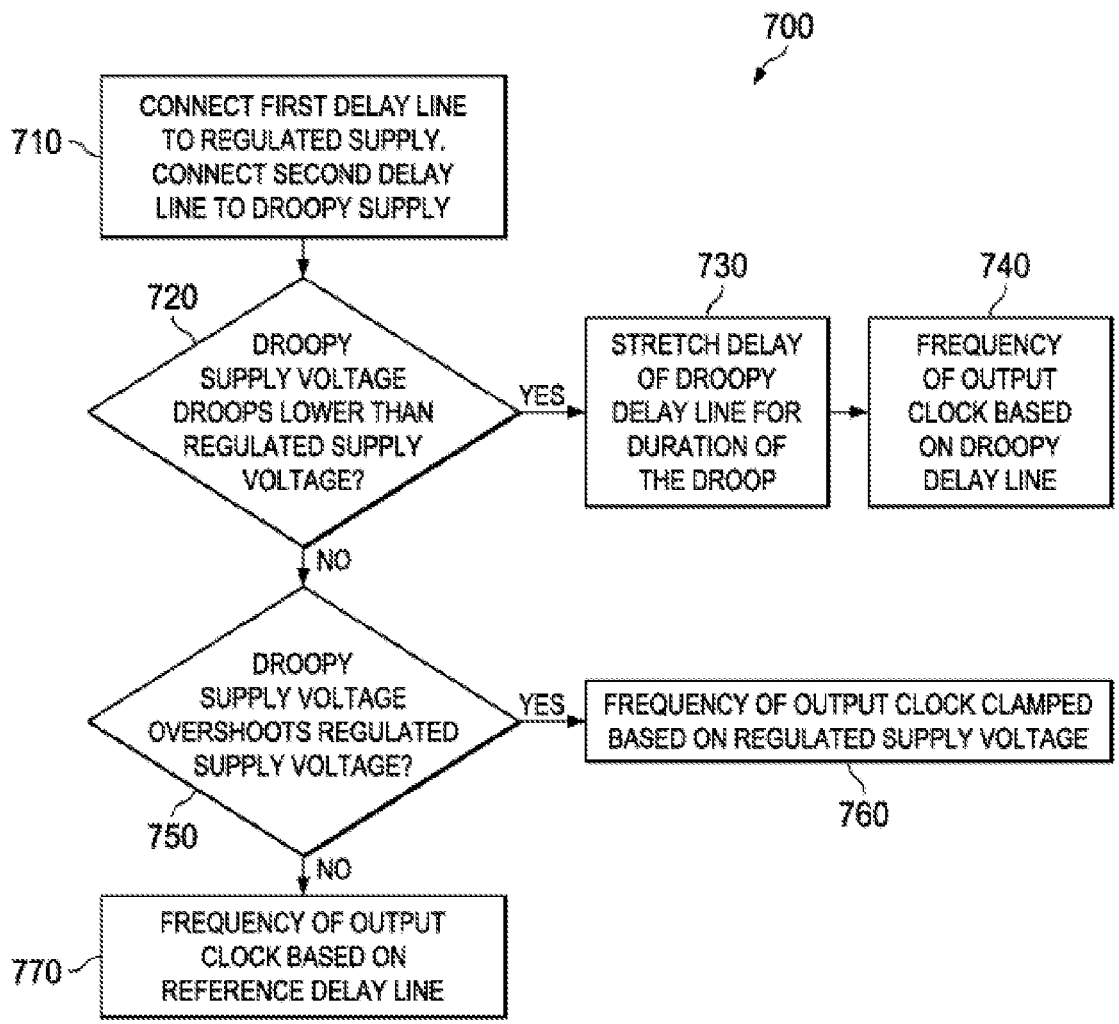
FIG. 7 illustrates a detailed flowchart of the operation of the Adaptive Oscillator Circuit in accordance with an illustrative embodiment of the disclosure.

FIG. 7 illustrates a detailed flowchart 700 of the operation of the adaptive oscillator circuit according to an illustrative embodiment of the disclosure. At block 710, a first delay line is connected to a regulated supply and a second delay line is connected to a droopy supply. At a block 720, it is determined whether the droopy supply voltage droops lower than the regulated supply voltage. In response to a determination that the droopy supply voltage is lower than the regulated supply voltage, at a block 730, the delay of the droopy delay line is stretched for the duration of the droop. At a block 740, the frequency of the output clock, ClockOut, is based on the droopy delay line. In response to a determination at a block 720 that the droopy supply voltage does not droop below the regulated supply voltage, it is determined at a block 750 whether droopy supply voltage overshoots the regulated supply voltage. In response to a determination that the droopy supply voltage overshoots the regulated supply voltage, at a block 760, the frequency of the output clock is clamped based on the regulated supply voltage. At a block 770, in response to a determination that the droopy supply voltage is not higher than the regulated supply voltage, the output frequency of the system clock is based on the regulated supply.

Figure 8:
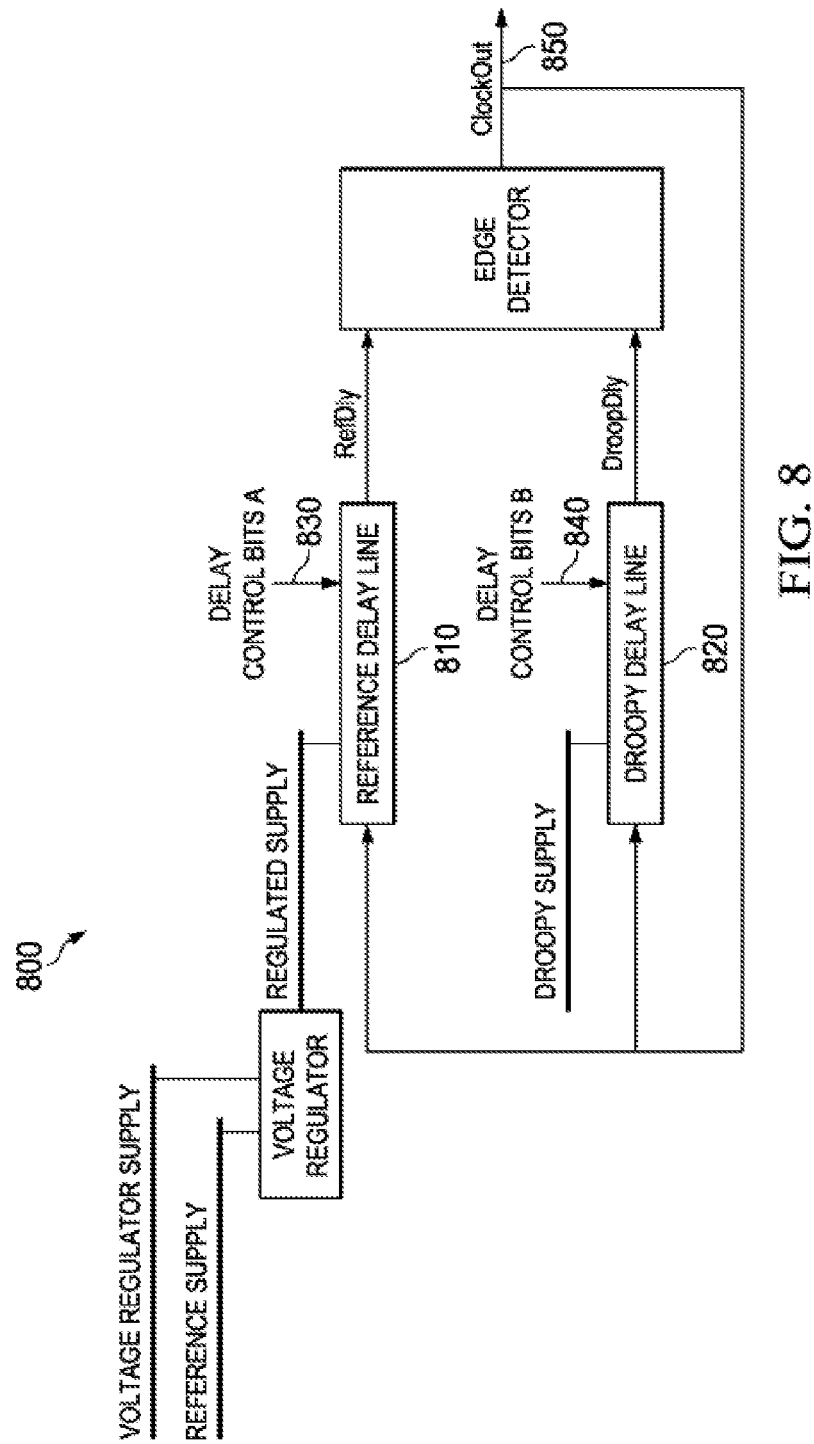
FIG. 8 illustrates an embodiment of the frequency control of the Adaptive Oscillator Circuit in accordance with the illustrative embodiment of the disclosure.

FIG. 8 illustrates an embodiment of the control of the adaptive oscillator circuit 800 in accordance with an illustrative embodiment of the disclosure. In the illustrative example, reference delay line 810 and droopy delay line 820 are identical to each other. One or more delay control bits 830 and 840 may be used to control the propagation delay through each delay line. The delay control bits may come from a controller in the same system as the adaptive oscillator circuit 800. In an illustrative embodiment of the disclosure, delay control bits 830 and 840 may be set by the frequency control word, fcw[x:0] 141 of FIG. 1. In one embodiment, the values of the delay control bits 830 and 840 may be the same. In another embodiment, the values of the delay control bits 830 and 840 may be different. When the delay control bits 830 and 840 are the same, the propagation delay through the reference delay line 810 and the droopy delay line 820 is the same and the frequency of the output clock, ClockOut 850, is determined by the slower delay of the reference delay line 810 or the droopy delay line 820.

When the delay control bits 830 and 840 are different, the propagation delay through the reference delay line 810 and the droopy delay line 820 are different. However, the delay control bits 830 and 840 may be adjusted so the propagation delay of the droopy delay line 820 remains within a threshold that controls the overshoot of the adaptive oscillator circuit output clock frequency.

Figure 9:
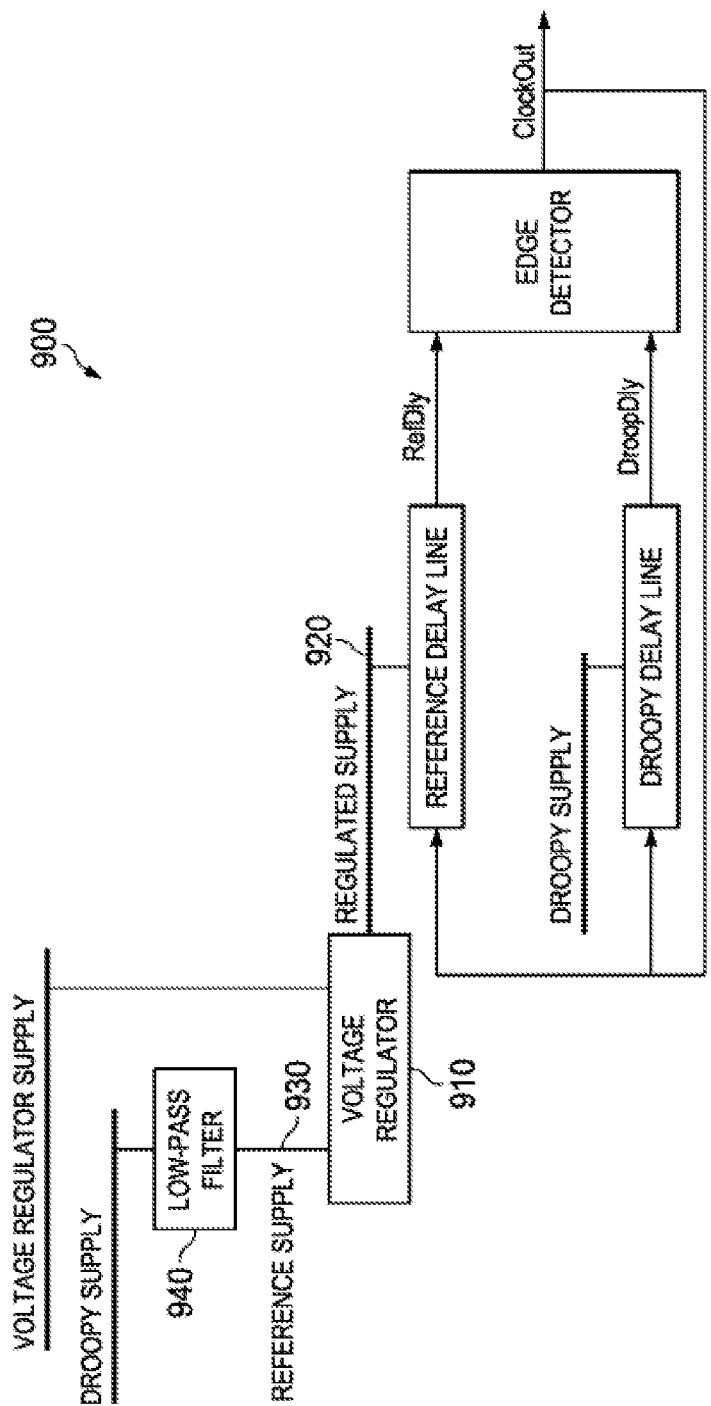
FIG. 9 illustrates a detailed view of the reference supply voltage implementation in accordance with an illustrative embodiment of the disclosure.

FIG. 9 illustrates a detailed view of the reference supply voltage implementation 900 in accordance with an illustrative embodiment of the disclosure. As depicted, voltage regulator 910 outputs a regulated supply 920. The voltage level of the regulated supply 920 is maintained at a same level as the reference supply 930 by operation of the voltage regulator 910. It must be noted that the voltage level of the regulated supply 920 should be as stable as possible with minimal variation on the supply line. The reference supply voltage may be a cleaner version of the droopy supply which may be the core power supply that powers all the chip components or some other input voltage. In some embodiments, the voltage regulator may include a low pass filter 940 to remove any noise on the droopy supply voltage line.

Figure 10:
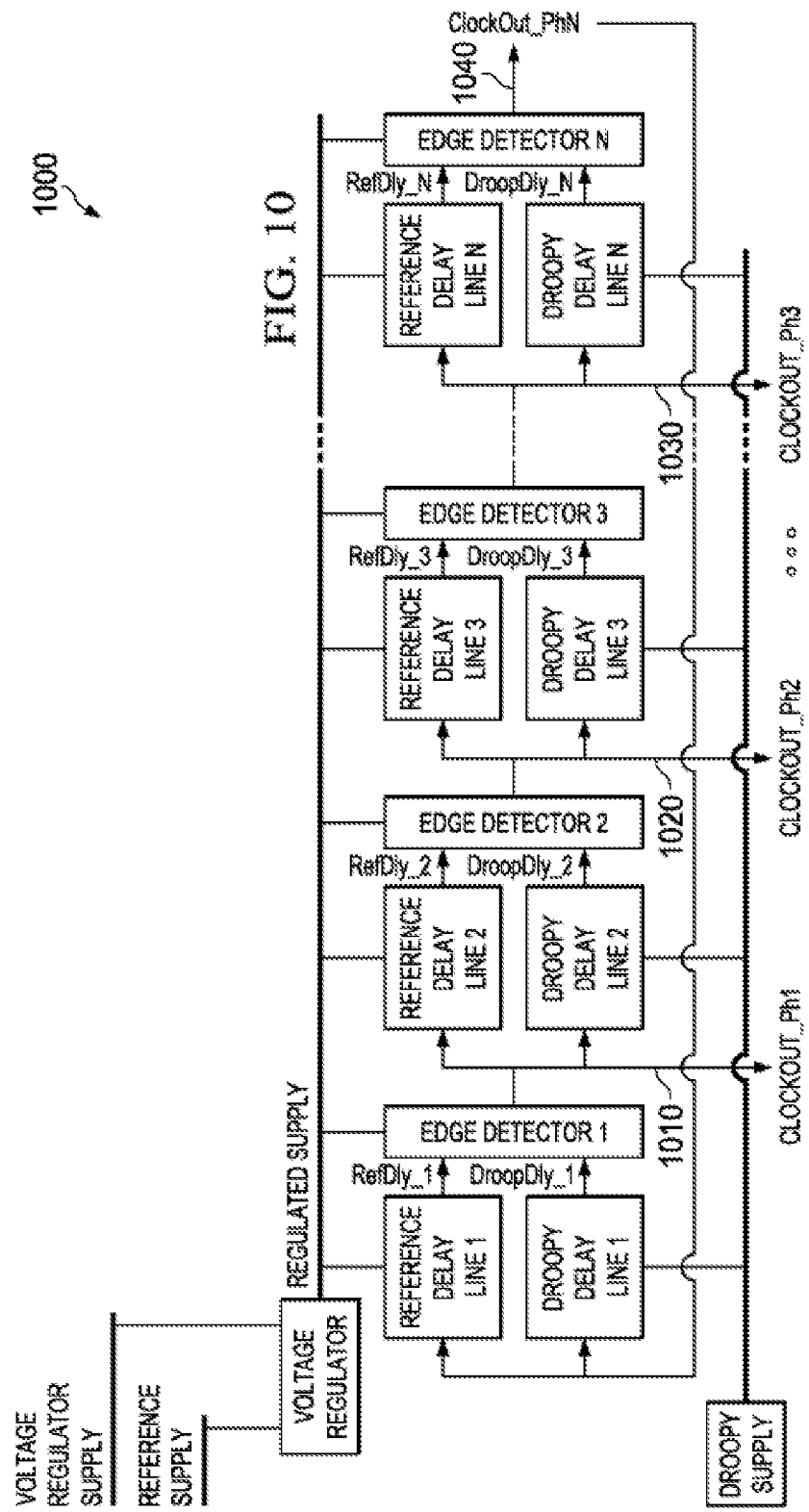
FIG. 10 illustrates a multistage implementation of the Adaptive Oscillator Circuit in accordance with an illustrative embodiment of the disclosure.

FIG. 10 illustrates a multistage implementation 1000 of the adaptive oscillator circuits in accordance with an illustrative embodiment of the disclosure. In the illustrative embodiment of FIG. 10, a number of AOC blocks may be connected together as in a ring oscillator format to generate a number of multiphase clocks. Each AOC block may be considered as a stage that outputs a clock of a particular phase. Each stage of the ring of AOC blocks may output a clock of a certain phase which also is input to the next stage in the ring. The output clock of the last stage in the ring, ClockOut_PhN 1040, feeds back to the inputs of the first stage in the ring. It must be noted that a logic inversion function must be maintained in this ring format. In the depicted example, ClockOut phase outputs depicted as ClockOut_Ph1 1010, ClockOut_Ph2 1020, ClockOut_Ph3 1030, and ClockOut_PhN 1040 represent multiphase clock outputs having a fixed timing relationship between each ClockOut phase output. The clockout phase outputs may be used in the system for components that require multiple clock phases such as, without limitation, a fractional divider.

The illustrations of FIGS. 8-10 are not meant to imply physical or architectural limitations to the manner in which different advantageous embodiments may be implemented. Other components in addition and/or in place of the ones illustrated may be used. Some components may be unnecessary in some advantageous embodiments. Also, the blocks are presented to illustrate some functional components. One or more of these blocks may be combined and/or divided into different blocks when implemented in different advantageous embodiments.

In some embodiments, the apparatus and techniques described above are implemented in a system comprising one or more integrated circuit (IC) devices (also referred to as integrated circuit packages or microchips), such as the Frequency Lock Loop described above with reference to FIGS. 1-4. Electronic design automation (EDA) and computer aided design (CAD) software tools may be used in the design and fabrication of these IC devices. These design tools typically are represented as one or more software programs. The one or more software programs comprise code executable by a computer system to manipulate the computer system to operate on code representative of circuitry of one or more IC devices so as to perform at least a portion of a process to design or adapt a manufacturing system to fabricate the circuitry. This code can include instructions, data, or a combination of instructions and data. The software instructions representing a design tool or fabrication tool typically are stored in a computer readable storage medium accessible to the computing system. Likewise, the code representative of one or more phases of the design or fabrication of an IC device may be stored in and accessed from the same computer readable storage medium or a different computer readable storage medium.

Note that not all the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below.

In an embodiment, the delay lines of the adaptive oscillator circuit may include one or more buffers, such as, without limitation, programmable buffers connected in parallel. Another variation of the embodiment may include an array of buffers, such as, without limitation, tristate inverters, connected in parallel at each stage of a plurality of stages of the delay line. Each stage would include an edge detector that may output a clock of certain phase. In another embodiment, the delay lines may include load capacitors that may be adjusted to alter the sensitivity or the amount of change of delay as a function of fluctuations or variations of the droopy supply.

In yet another embodiment, connecting the Edge Detector to either the Regulated Supply or the Droopy Supply determines the sensitivity of the output clock frequency of the AOC to noise on the Droopy Supply line. In an illustrative example where the Edge Detector is connected to the Regulated Supply, the propagation delay through the Edge Detector remains stable because the Regulated Supply voltage level is stable. The Droopy Supply line may droop below the Regulated Supply Line and cause the propagation delay of the Droopy Delay Line to change and affect the period and frequency of the output clock of the AOC. The Droopy Delay Line may overshoot the Regulated Supply Line and cause the propagation delay through both the Reference Delay Line and the Edge Detector to remain the same and result in a clamp of the output clock frequency of the AOC. In another illustrative example where the Edge Detector is connected to the Droopy Supply, the Droopy Supply line may droop below the Regulated Supply line due to noise. This may cause an increase in the propagation delay through the Droopy Delay Line and the Edge detector, thereby increasing the frequency of the output clock of the AOC. Conversely, in this illustrative example, if the Droopy Supply Line overshoots the Regulated Supply Line because of noise, the propagation delay of the Reference Delay Line will not change, but the propagation delay of the Edge Detector will decrease and result in a frequency overshoot of the output clock of the AOC instead of the frequency being clamped.

In summary, the AOC functions like a ring oscillator and outputs a clock whose frequency is automatically adjusted in proportion to its propagation delay changes that are due to power supply voltage fluctuations. The purpose of the AOC is to temporarily slow down a clock when noise exists so as to maintain timing margins on a chip and prevent circuit failure. The adaptive oscillator circuit works directly with the droopy power supply that may be fluctuating because of noise and automatically slows down the clock frequency for the duration of the noise that causes droop. The clock frequency automatically modulates down in response to the noise that causes droop on the droopy supply line but is clamped to a frequency determined by a regulated supply in cases where the noise results in a voltage overshoot on the droopy supply that exceeds the regulated supply.

Figure 11:
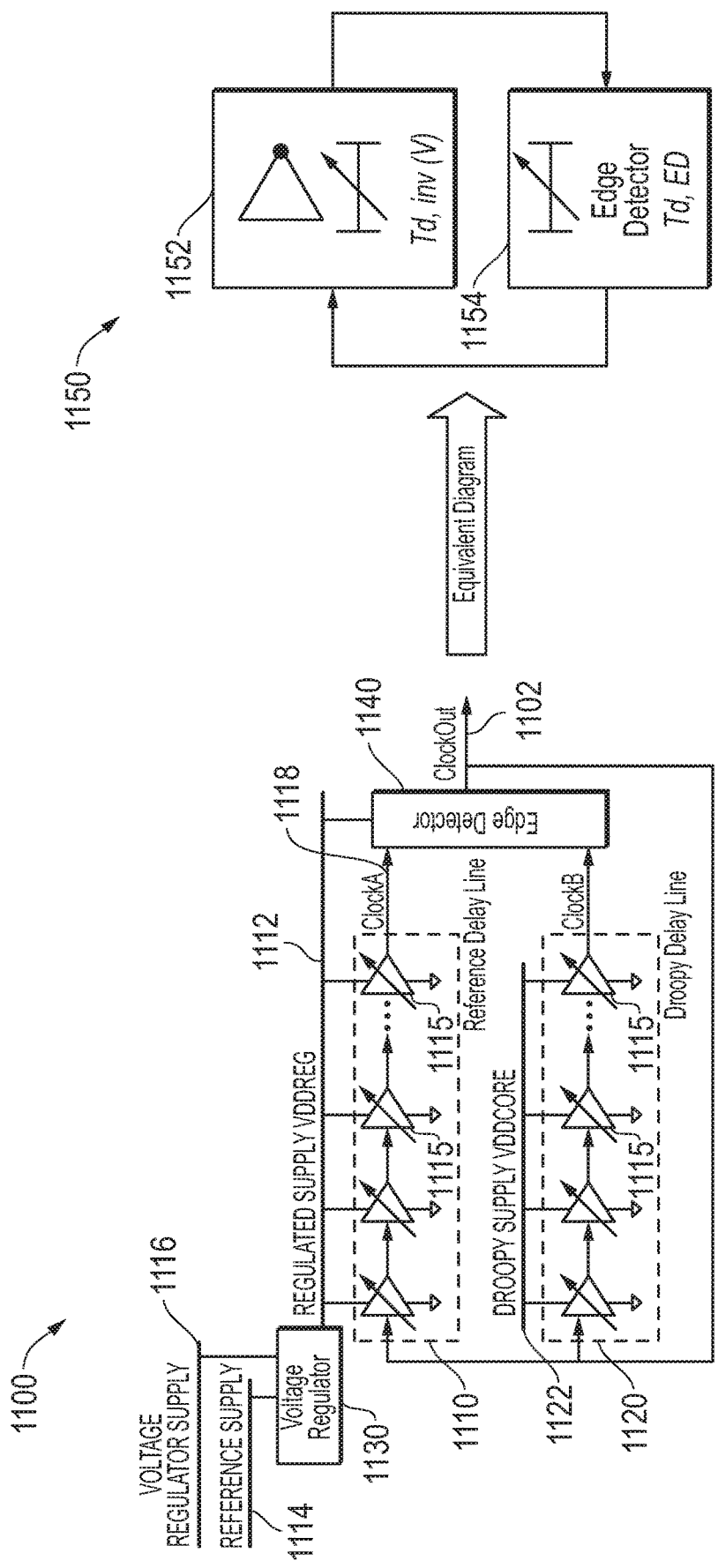
FIG. 11 shows in mixed circuit diagram and block diagram form an oscillator circuit along with a functionally equivalent diagram.

FIG. 11 shows in mixed circuit diagram and block diagram form an oscillator circuit 1100 along with a functionally equivalent diagram 1150 according to some embodiments. Generally, the oscillator circuit 1100 of this embodiment is arranged similarly to that of FIG. 2, and may be used in the clock generator system such as that of FIG. 1, or other suitable adaptive oscillator systems or digitally controlled oscillator (DCO) systems. Oscillator circuit 1100 includes a reference delay line 1110 and a droopy delay line 1120 each constructed with a number of adjustable delay elements 1115. Edge detector 1140 may also be constructed with an adjustable delay. An equivalent diagram 1150 shows the oscillator circuit's functional equivalent as a combination of a delay line transfer function 1152 connected in a feedback loop to an edge detector transfer function 1154. Both the delay line transfer function 1152 and the edge detector transfer function 1154 are shown as being adjustable in this embodiment. In some embodiments, only delay lines 1110 and 1120 have an adjustable delay, and in some embodiments only edge detector 1140 has an adjustable delay.

Generally, delay lines 1110 and 1120 are connected similarly to those of FIG. 2. Reference delay line 1110 is connected to a regulated supply 1112 that is generated from voltage regulator 1130. Voltage regulator 1130 is supplied by a voltage regulator supply 1116 and generates regulated supply 1112 based on the voltage from reference supply 1114. In some embodiments, the reference supply 1114 may be the core power supply, which may correspond to droopy supply 1122. Droopy supply 1122 supplies voltage for droopy delay line 1120. The droopy supply 1122 may be the input or core power supply, VDDCORE, that supplies the operating voltage for a processor core or for all the components on a system-on-chip.

Reference delay line 1110 provides a delayed signal, ClockA 1118, as one input to edge detector 1140. The droopy delay line 1120 provides a delayed signal, ClockB 1124 as another input to edge detector 1140. Based on the two inputs, edge detector 1140 generates an output clock, ClockOut 1102. ClockOut 1102 is also fed to the inputs of both reference delay line 1110 and droopy delay line 1120. ClockOut 1102 is fed back to both reference delay line 1110 and droopy delay line 1120 at the same time. Changes in polarity may also be implemented inside reference delay line 1110 and the droopy delay line 1120.

Edge detector 1140 toggles its output ClockOut 1102 only when both of its inputs are of the same polarity. For example, when both ClockA 1118 and ClockB 1124 are at the same polarity of logic zero "0" or logic one "1", the output ClockOut 1102 toggles or changes polarity. A change in polarity is said to occur when a signal changes from a first defined state to a different second defined state, for example, without limitation, from 0 to 1. Edge detector 1140 may be constructed as a Muller C-Element or other suitable edge detector circuit.

The behavior of oscillator circuit 1100 is characterized by equivalent diagram 1150. Output clock 1102 has a frequency F with a voltage sensitivity to the voltage of droopy supply 1122 represented as frequency-vs-voltage (VF) curve given by equation (1), where $F_0$ is a fixed frequency offset, and S is the slope depending on the delay line transfer function 1152 and the edge detector transfer function 1154:

$$F = F_0 + S*V \quad (1)$$

The delay line transfer function 1152 and the edge detector transfer function 1154 each have a delay affecting the output clock frequency F. Transfer function 1152, Td, inv(V) represents the combined inverter delay line delay of delay lines 1110 and 1120, which has power supply voltage dependency for the droopy delay line 1120. Transfer function 1154, Td, ED represents a delay characteristic of edge detector 1140 in responding to changes in the inputs to toggle the output. This delay is relatively stable unless it is deliberately adjusted, because edge detector 1140 is supplied from the stable voltage from the internal voltage regulator. The dependence of F on these two delays is given by equation (2):

$$F = \frac{1}{2 \cdot (Td, inv(V) + Td, ED)} \quad (2)$$

From equation 1 and equation 2, the slope S of the frequency-vs-voltage curve for output clock 1102 may be found, and is given by equation (3):

$$F_0 + S \cdot V = \frac{1}{2 \cdot (Td, inv(V) + Td, ED)}, \quad (3)$$
$$S = \frac{1}{2 \cdot (Td, inv(V) + Td, ED) \cdot V} - \frac{F_0}{V}$$

Figure 12:
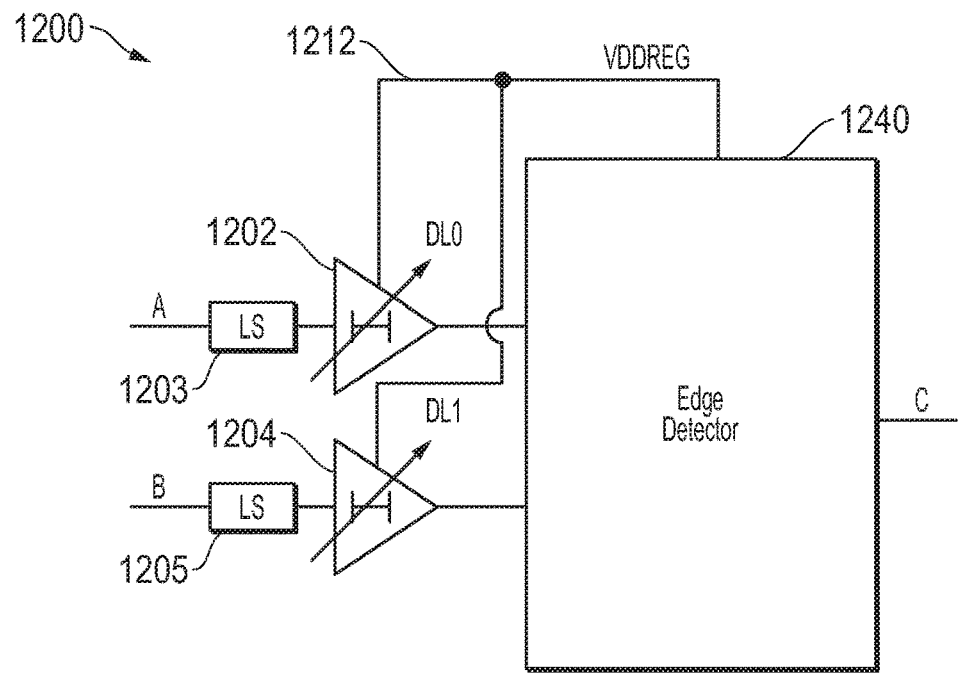
FIG. 12 shows in mixed circuit diagram and block diagram form an edge detector circuit with adjustable delay elements according to some embodiments.
Figure 13:
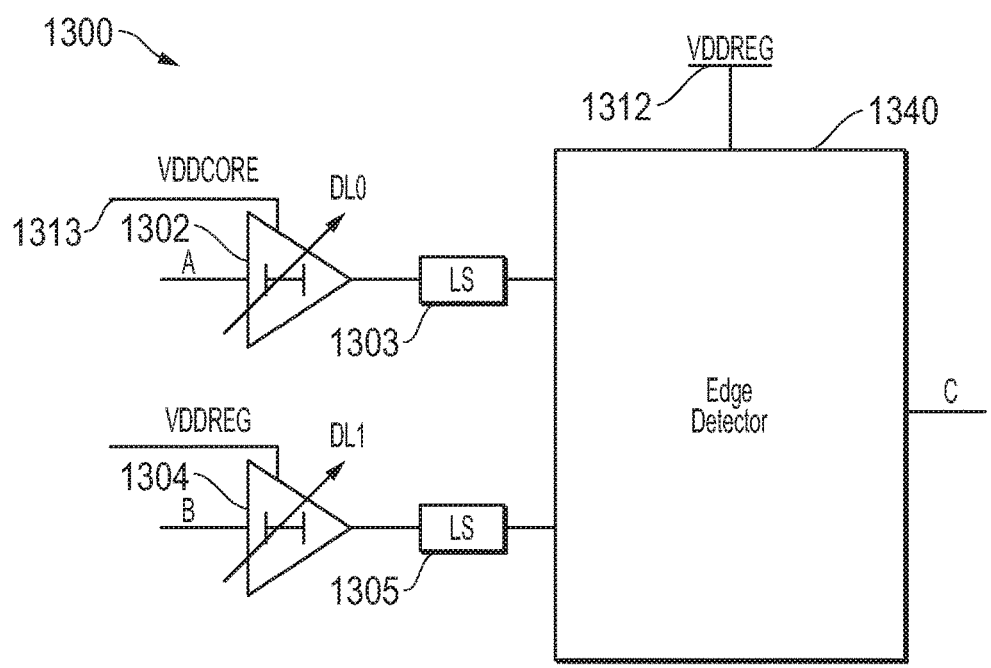
FIG. 13 shows in mixed circuit diagram and block diagram form another edge detector circuit with adjustable delay elements according to some embodiments.

From equation (3) it is seen that if the edge detector delay characteristic Td,ED is adjustable and its value is changed, the slope S will change respectively since Td,inv(V)/Td,ED ratio will change. The VF curve slope S can be changed by any adjustment that changes the ratio between delays in the delay lines 1110 and 1120 and in the edge detector 1140. Such a change can be produced by providing an adjustable delay in at least one of reference delay line 1110, droopy delay line 1120, and edge detector 1140, any of which can be adjusted to alter the delay characteristic of the edge detector 1140 relative at either one or both of the other two delays. FIGS. 12 and 13 provide examples of edge detector designs in which adjustable delay elements are included to enable changing the VF curve slope S.

FIG. 12 shows in diagram form an edge detector circuit 1200 with adjustable delay elements according to some embodiments. Edge detector circuit 1200 may be used for edge detector 1140 in the design of FIG. 11. Edge detector circuit 1200 has two inputs A and B, which are connected to ClockA 1118 and Clock B 1124, respectively, and an output C which provides the ClockOut 1102. The edge detector 1240 portion of the circuit is constructed as discussed above. Edge detector circuit 1200 includes an adjustable delay elements 1202 and 1204, each supplied by a regulated voltage supply 1212.

Input B connects to a level shifter 1205 for shifting the input signal level from droopy supply level which supplies droopy delay line 1120 to the level of regulated voltage supply 1212. Input A also connects to a level shifter 1203, which in this embodiment is not required to perform a voltage shift because the regulated supply 1212 is used on both sides of the shifter, but instead provides that both input as inputs A and B have approximately equal propagation delays.

The output of level shifter 1203 connects to the input of adjustable delay element 1202. The delay DL0 of adjustable delay element 1202 is programmable or controllable typically through control bit lines (not shown). The output of delay element 1202 is connected to the first input of edge detector 1240, and in operation carries a ClockA signal like that of FIG. 11. Similarly, the delay DL1 of delay element 1204 is adjustable. Delay element 1204 connects the output of level shifter 1205 to the second input of edge detector 1240. Delay DL1 is also programmable similarly to delay DL0. Preferably, the adjustable delay elements 1202 and 1204 (and the corresponding elements in FIG. 13) are implemented with a series of inverters with selectable output branches after each inverter that allow the delay line output to be connected to a desired location along the series of inverters, Other suitable delay line implementations may also be used, such as those shown in FIG. 15 and FIG. 16, for example.

In operation, the total delay of edge detector circuit 1200 is adjusted by altering delays DL0 and DL1, preferably with identical delays, thereby altering the VF curve slope S as can be understood from the equations discussed above. By adding delay through delay elements supplied from the stable regulated power supply, the use of edge detector circuit 1200 makes VF curve shallower than a similar circuit without such delay, thus reducing the oscillator's sensitivity to the core power supply variation.

FIG. 13 shows in diagram form another edge detector circuit 1300 with adjustable delay elements according to some embodiments. Edge detector circuit 1300 may also be used in the design of FIG. 11, and includes two inputs A and B, and an output C. In the depicted circuit, delays DL0 and DL1 are provided by two adjustable delay elements 1302 and 1304 that are supplied with two different power supplies.

Input A is connected to the input of adjustable delay element 1302, which is supplied with the droopy power supply 1313, the core supply VDDCORE in this embodiment. The output of adjustable delay element 1302 is connected to level shifter 1303, which shifts the voltage levels from the VDDCORE level (droopy voltage supply 1313) to the VDDREG level (regulated voltage supply 1312) that is used by edge detector 1340. The output of level shifted 1303 is connected to the first input of edge detector 1340.

Adjustable delay element 1304 receives the signal on input B, and is supplied by regulated voltage supply 1312. The output of adjustable delay element 1304 is connected to the input of level shifter 1305. Level shifter 1305 serves to equalize the signal path of input A to that of input B, and does not actually shift the voltage level since the same supply is used on either side of level shifter 1305.

The delays of adjustable delay elements 1302 and 1304 may be frequently asymmetric in operation of an oscillator using edge detector circuit 1300. This arrangement supplies the delay element 1302 which receives signal ClockA from the reference delay line (FIG. 11) with the droopy voltage supply, while supplying delay element 1304 which receives the ClockB signal from the droop delay line with the regulated power supply. Such an arrangement helps to avoid oscillator frequency overshoot because the regulated power supply signal path usually has the longer delay if there is no exact symmetry in the circuit. In operation within the oscillator circuit, the use of the droopy supply voltage to supply delay element 1302 provides that delay element 1302 will usually have the longer delay if there is asymmetry in delays DL0 and DL1. The addition of delay elements supplied from the droopy power supply (which is the same as VDDCORE 1313 in this example) makes the oscillator circuit's VF curve steeper, thus increasing the oscillator circuit's sensitivity to the core power supply variation.

Figure 14:
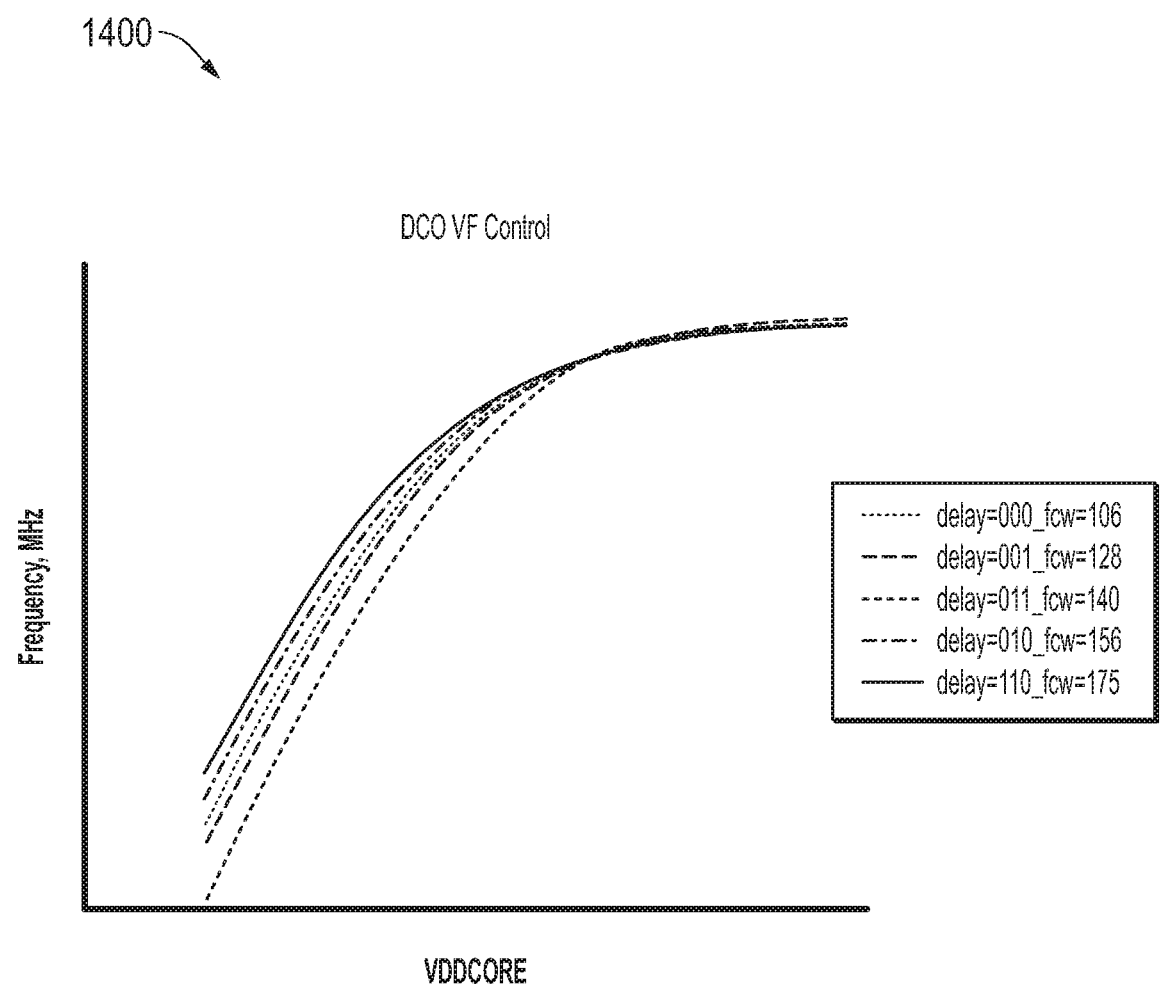
FIG. 14 shows a graph of VF curves of an oscillator circuit or DCO with an edge detector circuit like that of FIG. 13.

FIG. 14 shows in chart form plot of VF curves of an oscillator circuit or DCO with an edge detector circuit like that of FIG. 13. The vertical axis shows the clock frequency of ClockOut in MHz, and the horizontal axis shows the droopy supply voltage, which is VDDCORE in this example. Five plots are shown representing five different delay settings used with the adjustable delay elements 1302 and 1304.

To control VF curve, the circuit is adjusted to change the Td,nv(V)/Td,ED ratio by changing correspondent delay settings for delay elements 1302 and 1304. The VF curve setting change results in the oscillation frequency changing as the performance curve of the oscillator circuit adapts as depicted. The delay settings shown on the plot legend ("000" to "110") represent a series of digital Gray codes which are translated into corresponding "one hot" codes and used to change the states of adjustable delay elements 1302 and 1304 of edge detector circuit 1300. The chart legend also shows fcw (frequency control word) settings, which represent the DCO frequency control input code associated with each delay setting. To compensate for the DCO oscillation frequency change due to the change in the curves slope and bring the DCO oscillation frequency to the specified target, the DCO frequency control input code (fcw) is adjusted for each respective delay setting.

Figure 15:
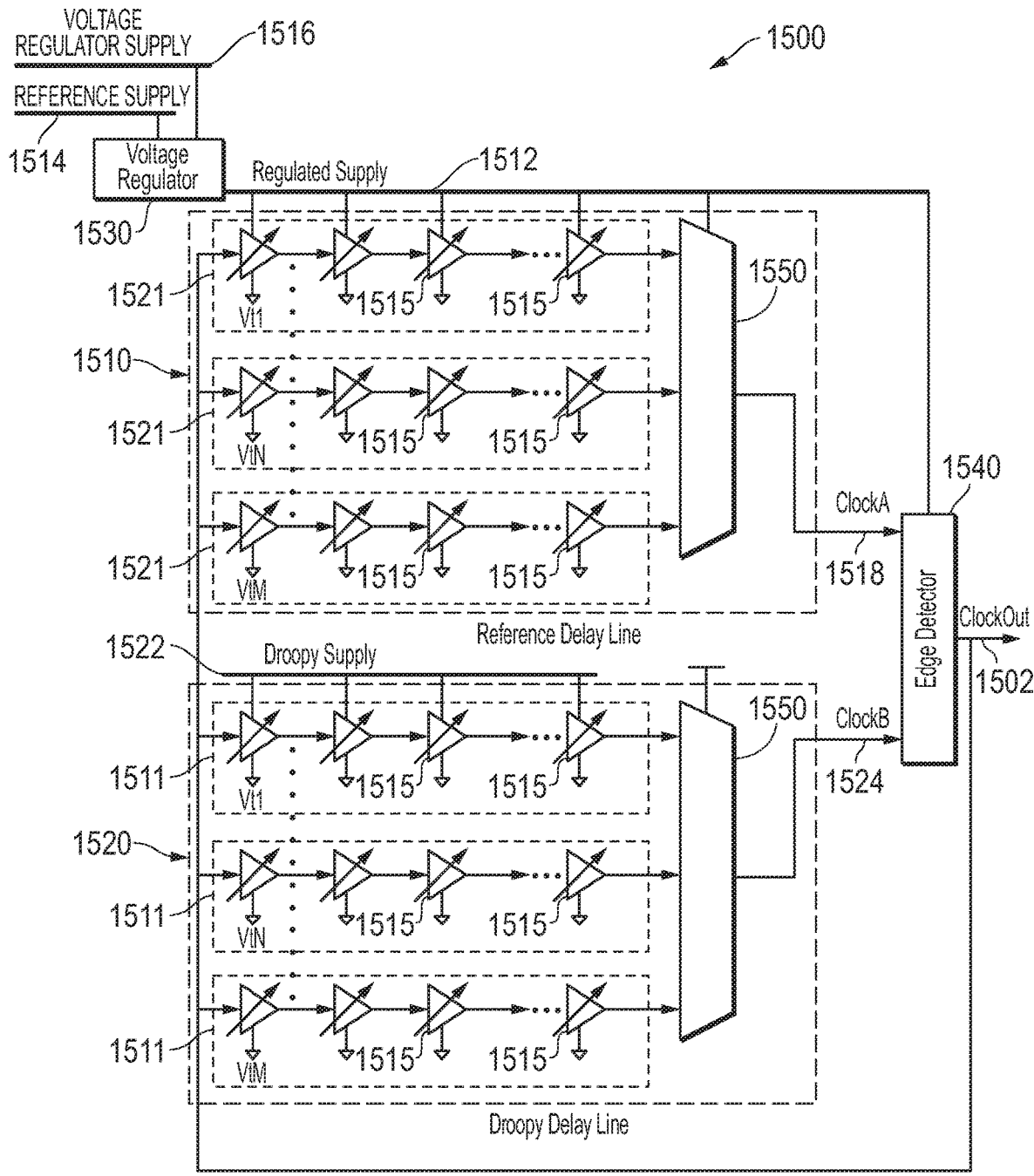
FIG. 15 shows in mixed circuit diagram and block diagram form an oscillator circuit including adjustment delay lines to implement the reference delay line and droopy delay line according to some embodiments.

FIG. 15 shows in circuit diagram form an oscillator circuit 1500 including adjustment delay lines to implement the reference delay line 1510 and droopy delay line 1520. Oscillator circuit 1500 is an adaptive oscillator circuit and may be used in the clock generator system such as that of FIG. 1. Oscillator circuit 1500 of this embodiment includes an edge detector 1540 producing a ClockOut signal 1502 based on the two inputs as discussed above. ClockOut signal 1502 is fed back to the inputs of reference delay line 1510 and a droopy delay line 1520. The outputs of the delay lines are fed to the two input terminals of edge detector 1540 as signal ClockA 1518 and signal ClockB 1524. Each delay line is constructed with a number of parallel adjustment delay lines 1521, which are connected to selection circuitry 1550 operable to couple a selected adjustment delay line 1521 to the output of the respective delay line.

The parallel adjustment delay lines 1521 each include inverters 1515 constructed with MOS (metal oxide semiconductor) transistors, or the inverters 1515 as a whole, having different respective Vts (threshold voltages), the voltage applied between gate and source of a MOS FET that is required to turn the device on for linear and saturation regions of operation. Providing variable Vts is preferably accomplished using process variations allowed within normal manufacturing processes, which allow for different MOS devices to be produced a few different options available for the Vt (threshold voltage).

The threshold voltages are shown in the drawing by the labels such as Vt1 for the top-depicted adjustment delay line 1521, VtN for the next adjustment delay line 1521, etc. Reference delay line 1510 includes a number M of adjustment delay lines 1521 with threshold voltages of Vt1-VtM, and droopy delay line 1520 includes adjustment delay lines 1521 using the same series of threshold voltages Vt1-VtM. The circuits implemented with different Vt's have different delays. The delay of each delay line is adjusted by selecting a new adjustment delay line 1521 with a different Vt using selection circuitry 1550. This changes the Td,nv(V)/Td,ED ratio and for oscillator circuit 1500, causing a change of the VF curve slope. In this embodiment, every inverter within a particular the adjustment delay line uses the depicted threshold voltage. However, using a uniform threshold voltage for all delay elements in the delay line is not limiting, and the relevant delays may be made adjustable with only some of the inverters using an adjusted threshold voltage, and the remaining inverters using a default threshold voltage.

Selection circuitry 1550 may be implemented as a multiplexer or other suitable selection circuitry which is controllable through a control input (not shown) to pass through a selected one of multiple inputs to a single output. Selection circuitry 1550 of reference delay line 1510 is supplied with the regulated supply 1512. Selection circuitry 1550 of droopy delay line 1520 may be supplied with the droopy supply 1522 or the regulated supply 1512.

Reference delay line 1510 is connected to a regulated supply 1512 that is generated from voltage regulator 1530. Voltage regulator 1530 is supplied by a voltage regulator supply 1516 and generates regulated supply 1512 based on the voltage from reference supply 1514. In some embodiments, the reference supply 1514 may be the core power supply, which may correspond to droopy supply 1522. Droopy supply 1522 supplies voltage for droopy delay line 1520. The droopy supply 1522 may be the input or core power supply that supplies the operating voltage for all the components on a system-on-chip.

Edge detector 1540 works similarly to that discussed with regard to FIG. 2, and does not include adjustable delays in this embodiment. In other embodiments, edge detector 1540 may also include adjustable delays.

Figure 16:
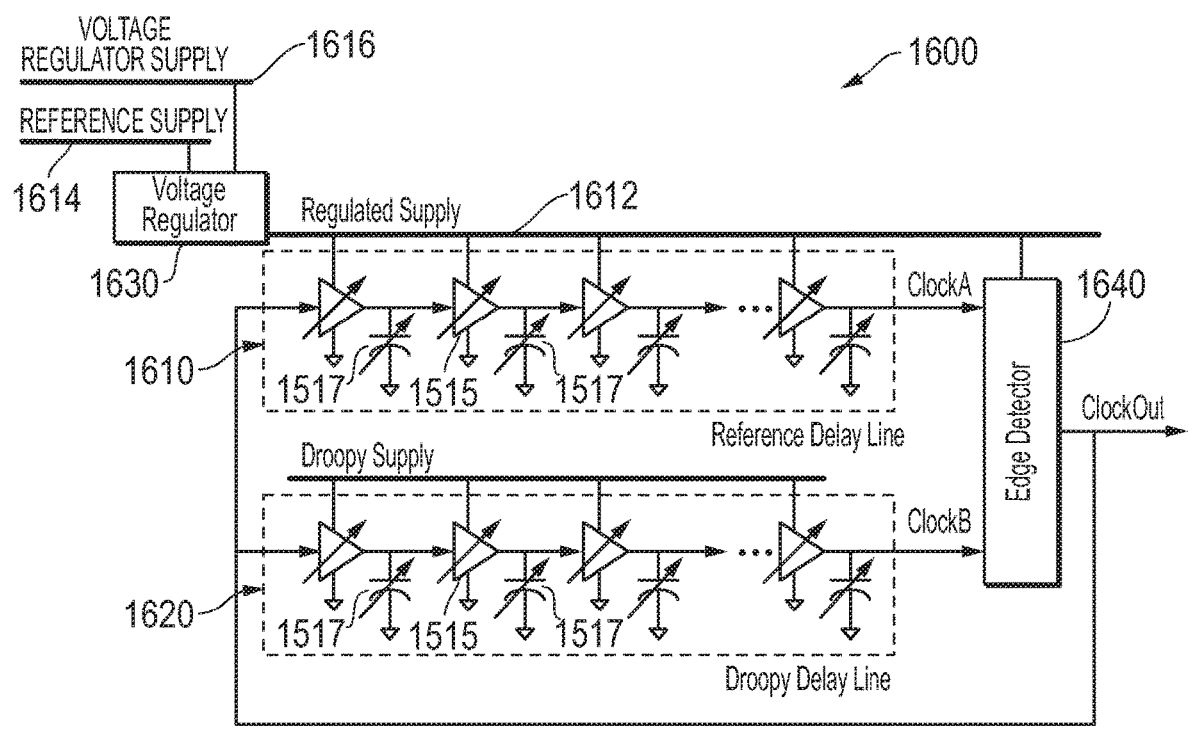
FIG. 16 shows in mixed circuit diagram and block diagram form an oscillator circuit including programmable capacitors for adjusting the delay of reference delay line and droopy delay line according to some embodiments.

FIG. 16 shows in circuit diagram form an oscillator circuit 1600 including programmable capacitors 1517 for adjusting the delay of reference delay line 1510 and droopy delay line 1520. Generally, oscillator circuit 1600 is arranged similarly to the embodiments of FIG. 2 and FIG. 15, and includes an edge detector 1640 producing a ClockOut signal 1602 based on the two inputs as discussed above. Oscillator circuit 1600 is an adaptive oscillator circuit and may be used in the clock generator system such as that of FIG. 1. ClockOut signal 1602 is fed back to the inputs of reference delay line 1610 and a droopy delay line 1620. The outputs of the delay lines are fed to the two input terminals of edge detector 1640 as signal ClockA 1618 and signal ClockB 1624.

Reference delay line 1610 and droopy delay line 1620 are each constructed with a number of adjustable delay elements 1615, implemented as inverters connected in series. In this embodiment, the delay adjustment capability is implemented by adding programmable capacitors 1517 connected between the output of each adjustable delay element 1615 and ground or VSS.

Figure 17:
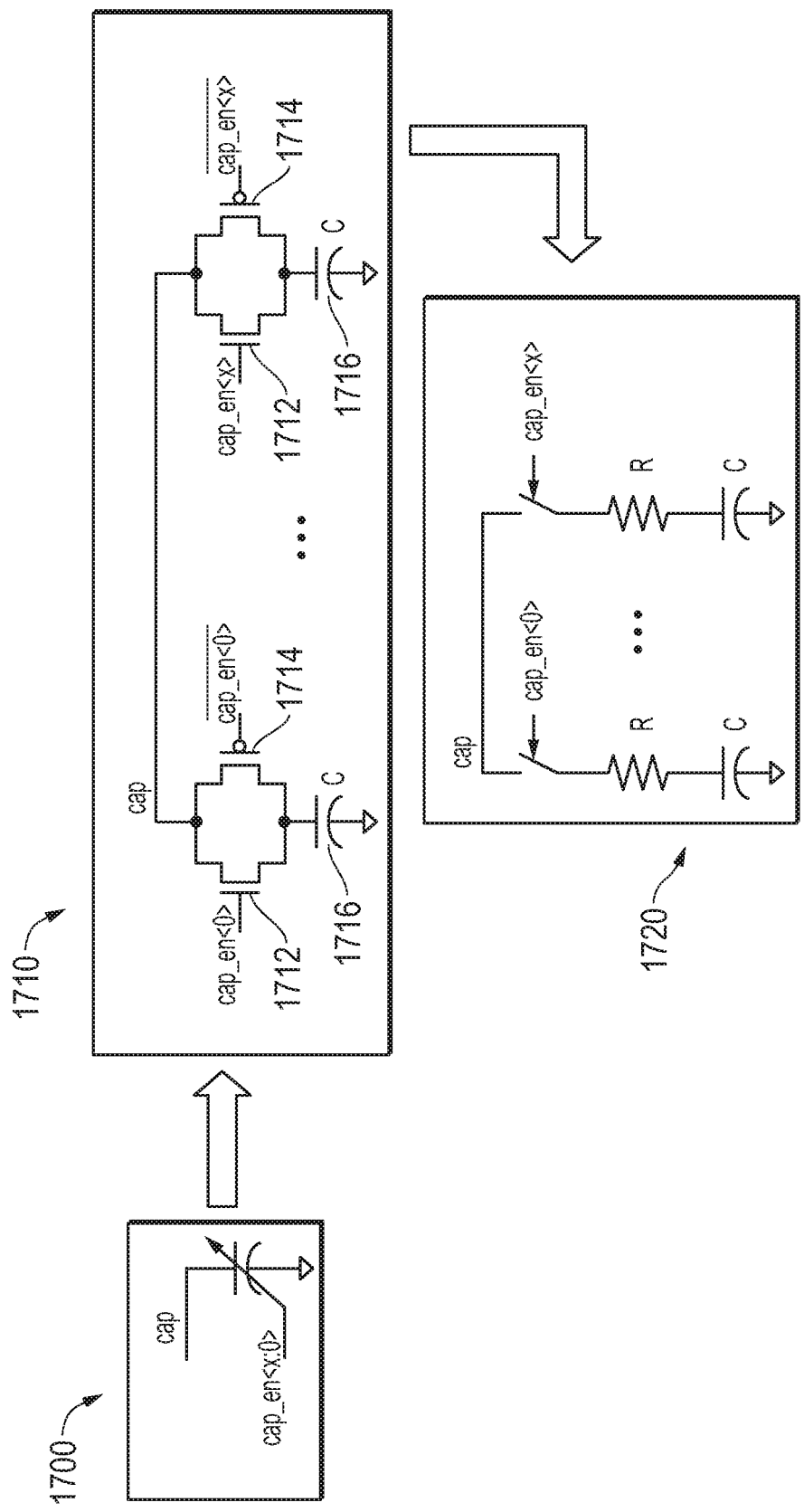
FIG. 17 shows in circuit diagram form a programmable capacitor along with an implementing circuit and an electrical equivalent circuit according to some embodiments.

FIG. 17 shows in circuit diagram form a programmable capacitor 1700 along with an implementing circuit 1710 and an electrical equivalent circuit 1720. The depicted circuit 1710 is merely one illustrative implementation, and other suitable circuits may be to implement a programmable or adjustable capacitor for use in adjustable delay elements herein.

Adjustable capacitor 1700 is shown as a symbol with a positive terminal labeled "cap" and an enable input which receives a multiple bit enable code "cap_en<x:0>" to program or adjust the capacitor's value.

The circuit 1710 implementing programmable capacitor 1700 includes and contain a number of capacitors 1716, each with a negative terminal connected to VSS and positive terminal selectively connected to the "cap" terminal through a complimentary pair of transistors, NMOS transistor 1712 and PMOS transistor 1714, which together function as an analog switch. Individual bits of the enable code are used to control the switch, as depicted by the cap_en<n> and inverted cap_en<n> signals applied to the gates of transistors 1712 and 1714. Other switch designs may be used such as single transistors.

As can be seen in the electrical equivalent circuit 1720, the bits of the enable code are applied to the circuit to selectively connect in parallel as many of the capacitors 1716 into the circuit as are desired, adjusting the capacitance of the circuit. The resistors R are shown to account for the non-zero impedance of the switches.

In operation, with circuit 1710 implementing each programmable capacitor 1517 (FIG. 15), if the 3dB cut-off frequency of the analog switch with impedance R and serial capacitor C is close to the DCO oscillation frequency, the DCO VF slope will change depending on the number of the programmable caps enabled. The analog switch series resistance R should be optimized to get a specified VF slope.

Figure 18:
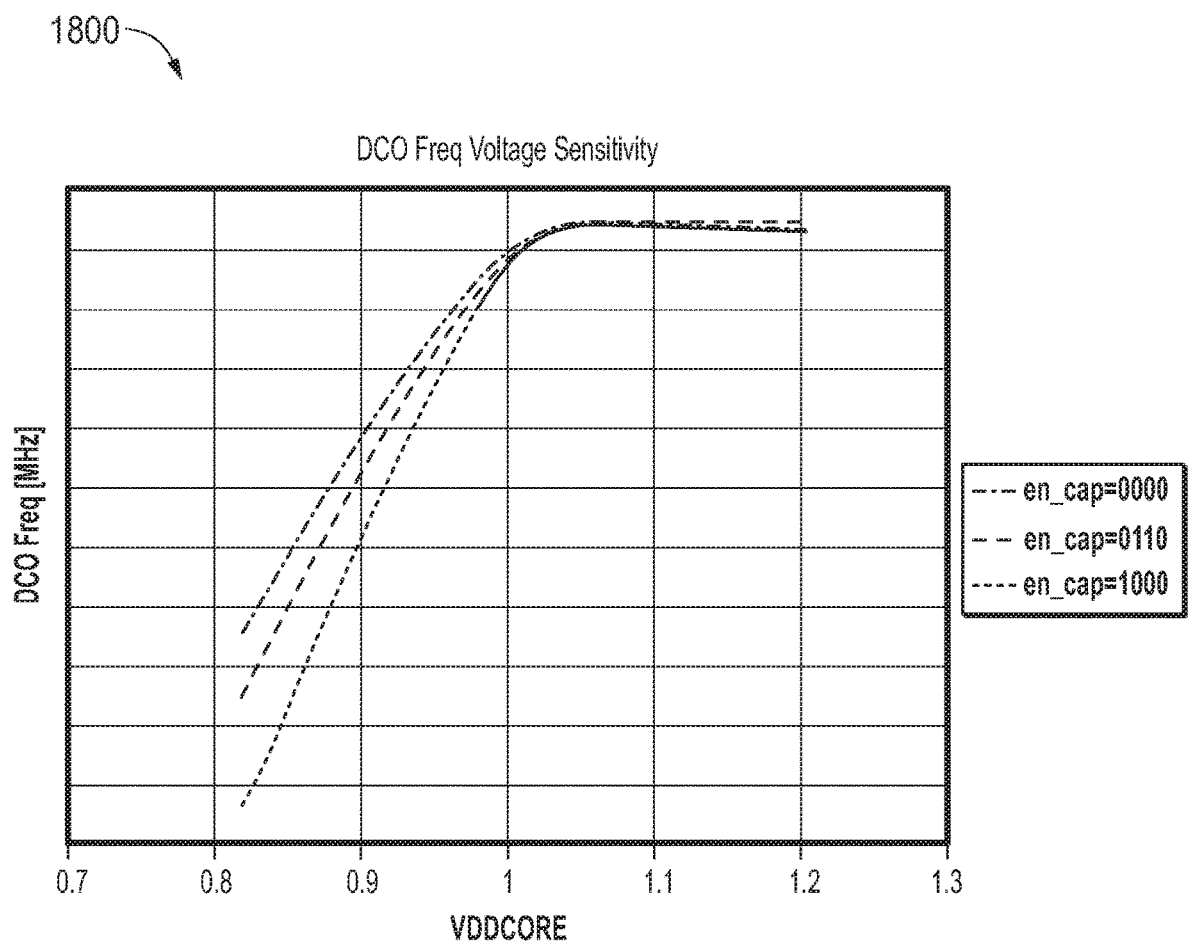
FIG. 18 shows a graph of VF of an oscillator circuit like that of FIG. 16.

FIG. 18 shows in chart form a plot of VF of an oscillator circuit like that of FIG. 16. The vertical axis shows the clock frequency of ClockOut in MHz, and the horizontal axis shows the droopy supply voltage, VDDCORE in this example. Three plots are shown representing three different delay settings achieved using different values of the enable code "en_cap<0:x>". As can be seen, generally a higher capacitance value slows down the adjustable delay circuit and produces a lower slope S, while a low capacitance value adjusts the delay to be quicker and produces a steeper slope S.

Figure 19:
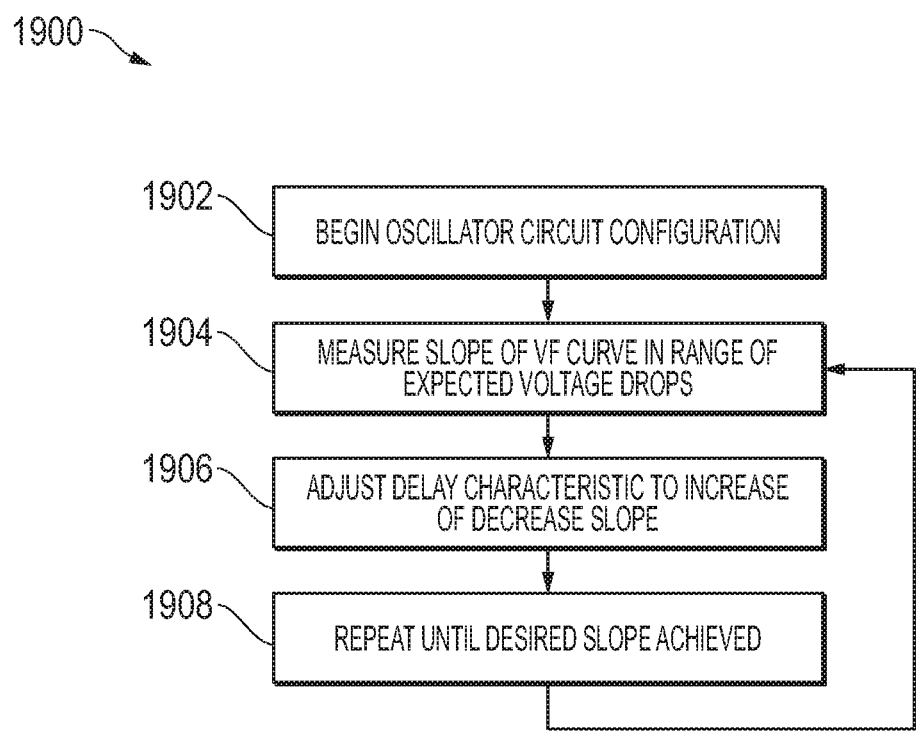
FIG. 19 shows in flow diagram form a method of operating an oscillator circuit according to some embodiments.

FIG. 19 shows in flow diagram form a method 1900 of operating an oscillator circuit according to some embodiments. Method 1900 is typically performed during configuration of the oscillator circuit such as those of FIG. 11, FIG. 15, and FIG. 16. The configuration may take place at boot time, reset, or may be a one-time configuration process depending on the hardware environment. At block 1904, the slope of the oscillator circuit's VF curve is measured through the expected operating range of the droopy supply voltage or the relevant core supply voltage, including expected voltage drops due to di/dt events and voltage spikes. Next at block 1906, the process adjusts the delay characteristic of the edge detector, the delay lines, or both, to increase or decrease the slope. As shown at block 1908, the measurement and adjustment process is repeated until the desired operating slope is achieved.

The various features herein may be used in combination to achieve a desired oscillator circuit performance for a particular application. For example, the edge detector delay adjustments described with respect to FIGS. 11-14 may be used in combination with reference and droopy delay lines using either the parallel adjustment delay lines of FIG. 15 or the programmable capacitors of FIG. 16. Further, the delay elements of FIGS. 12-13 may be implemented with either of the methods Benefits, other advantages, and solutions to problems have been described above with regards to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

The circuits herein or any portion thereof may be described or represented by a computer accessible data structure in the form of a database or other data structure which can be read by a program and used, directly or indirectly, to fabricate integrated circuits. For example, this data structure may be a behavioral-level description or register-transfer level (RTL) description of the hardware functionality in a high-level design language (HDL) such as Verilog or VHDL. The description may be read by a synthesis tool which may synthesize the description to produce a netlist including a list of gates from a synthesis library. The netlist includes a set of gates that also represent the functionality of the hardware including integrated circuits. The netlist may then be placed and routed to produce a data set describing geometric shapes to be applied to masks. The masks may then be used in various semiconductor fabrication steps to produce the integrated circuits. Alternatively, the database on the computer accessible storage medium may be the netlist (with or without the synthesis library) or the data set, as desired, or Graphic Data System (GDS) II data.

While particular embodiments have been described, various modifications to these embodiments will be apparent to those skilled in the art. Accordingly, it is intended by the appended claims to cover all modifications of the disclosed embodiments that fall within the scope of the disclosed embodiments.

What is claimed is:

1. An oscillator circuit comprising:
a first delay line having a signal input, a supply input for receiving a first voltage, and an output that transmits a first delayed signal at a first delay proportional to the first voltage;
a second delay line having a signal input, a supply input for receiving a second voltage, and an output that transmits a second delayed signal at a second delay proportional to the second voltage;
an edge detector having two inputs connected to the respective outputs of the first and second delay lines and generating an output clock based on a relationship between the first delayed signal and the second delayed signal, the output clock applied to the signal inputs of the first and second delay lines, the output clock exhibiting a voltage dependent frequency performance curve having a slope dependent at least on the second delay and a delay characteristic of the edge detector; and
wherein at least one of the first delay line, the second delay line, and the edge detector are operable to adjust the slope by altering the delay characteristic of the edge detector relative to at least one of the first and second delays and compensate for a change in frequency of the oscillator circuit due to the slope adjustment.

2. The oscillator circuit of claim 1, wherein the first voltage is a regulated supply voltage and the second voltage is a droopy supply voltage.

3. The oscillator circuit of claim 1, further comprising a first adjustable delay element coupled between the edge detector and the first delay line, and a second adjustable delay element coupled between the edge detector and the second delay line.

4. The oscillator circuit of claim 3, wherein the first adjustable delay element and the edge detector are supplied with the first voltage and the second adjustable delay element is supplied with the second voltage.

5. The oscillator circuit of claim 3, wherein the first adjustable delay element and the second adjustable delay element are supplied with the first voltage.

6. The oscillator circuit of claim 1, wherein the first and second delay lines each comprise:
a plurality of adjustment delay lines each receiving the output clock and constructed with MOS (metal oxide semiconductor) transistors having different respective Vts (threshold voltages); and
selection circuitry operable to selectably couple a selected adjustment delay line to the edge detector.

7. The oscillator circuit of claim 1, further comprising a plurality of adjustable capacitors coupled along the first delay line and the second delay line.

8. A system comprising:
a plurality of components in an integrated circuit, the integrated circuit including a clock tree;
a frequency locked loop circuit that generates a system clock that drives the clock tree; and
an oscillator circuit within the frequency locked loop circuit comprising:
a first delay line having a signal input, a supply input for receiving a first voltage, and an output that transmits a first delayed signal at a first delay proportional to the first voltage;
a second delay line having a signal input, a supply input for receiving a second voltage, and an output that transmits a second delayed signal at a second delay proportional to the second voltage;
an edge detector having two inputs connected to the respective outputs of the first and second delay lines and generating an output clock based on a relationship between the first delayed signal and the second delayed signal, the output clock applied to the signal inputs of the first and second delay lines, the output clock exhibiting a voltage dependent frequency performance curve having a slope dependent at least on the second delay and a delay characteristic of the edge detector;
wherein at least one of the first delay line, the second delay line, and the edge detector are operable to adjust the slope by altering the delay characteristic of the edge detector relative to at least one of the first and second delays and compensate for a change in frequency of the oscillator circuit due to the slope adjustment.

9. The system of claim 8, wherein the first voltage is a regulated supply voltage and the second voltage is a droopy supply voltage.

10. The system of claim 8, further comprising a first adjustable delay element coupled between the edge detector and the first delay line, and a second adjustable delay element coupled between the edge detector and the second delay line.

11. The system of claim 10, wherein the first adjustable delay element and the edge detector are supplied with the first voltage and the second adjustable delay element is supplied with the second voltage.

12. The system of claim 10, wherein the first adjustable delay element and the second adjustable delay element are supplied with the first voltage.

13. The system of claim 8, wherein the first and second delay lines each comprise:
a plurality of adjustment delay lines each receiving the output clock and each constructed with MOS transistors having a different Vt (threshold voltage); and
selection circuitry operable to selectably couple a selected adjustment delay line to the edge detector.

14. The system of claim 8, further comprising a plurality of adjustable capacitors connected along the second delay line.

15. A method of clock frequency adjustment in an oscillator circuit comprising:
connecting a first delay line to a regulated supply voltage and causing the first delay line to transmit a first delayed signal at a first delay proportional to the regulated supply voltage;
connecting a second delay line to a droopy supply voltage and causing the second delay line to transmit a second delayed signal at a second delay proportional to the droopy supply voltage;
connecting the first and second delay lines to first and second inputs of an edge detector that generates an output clock, the output clock exhibiting a voltage dependent frequency performance curve having a slope dependent at least on the second delay and a delay characteristic of the edge detector;

feeding the output clock as an input to the first and second delay lines; and adjusting the slope by altering the delay characteristic of the edge detector relative to at the one of the first and second delays and compensating for a change in frequency of the oscillator circuit due to the slope adjustment.

16. The method of claim 15, wherein altering the slope further comprises altering the delay characteristic of the edge detector.

17. The method of claim 15, further comprising coupling a first adjustable delay element between the edge detector and the first delay line, and coupling a second adjustable delay element between the edge detector and the second delay line.

18. The method of claim 17, further comprising supplying the first adjustable delay element and the edge detector with the regulated supply voltage, and supplying the second adjustable delay element with the droopy supply voltage.

19. The method of claim 17, further comprising supplying the first adjustable delay element and the second adjustable delay element with the regulated supply voltage.

20. The method of claim 15, wherein altering the slope further comprises adjusting at least one of a plurality of adjustable capacitors connected along the second delay line.

* * * * *